US009318620B2

(12) United States Patent
Barry et al.

(10) Patent No.: US 9,318,620 B2
(45) Date of Patent: Apr. 19, 2016

(54) FOLDED CONICAL INDUCTOR

(71) Applicant: International Business Machines Corporation, Armonk, NY (US)

(72) Inventors: Robert L. Barry, Essex Junction, VT (US); Robert A. Groves, Highland, NY (US); Venkata N. R. Vanukuru, Bangalore, IN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/294,485

(22) Filed: Jun. 3, 2014

(65) Prior Publication Data

US 2014/0264738 A1   Sep. 18, 2014

Related U.S. Application Data

(62) Division of application No. 13/654,529, filed on Oct. 18, 2012, now Pat. No. 8,836,460.

(51) Int. Cl.
*H01F 5/00* (2006.01)
*H01L 29/86* (2006.01)
(Continued)

(52) U.S. Cl.
CPC ............ *H01L 29/86* (2013.01); *H01L 23/5227* (2013.01); *H01L 28/10* (2013.01); *H01L 2924/0002* (2013.01)

(58) Field of Classification Search
CPC .......... H01F 17/0013; H01F 2017/002; H01F 5/003; H01F 27/2804; H01F 41/041

USPC .......................................................... 336/200
See application file for complete search history.

(56) References Cited

U.S. PATENT DOCUMENTS 6,707,367 B2   3/2004   Castaneda et al.
6,714,112 B2   3/2004   Beng et al.
(Continued)

OTHER PUBLICATIONS

C.-H. Wu et al., "Analysis and application of miniature 3D inductor," IEEE International Symposium on Circuits and Systems, ISCAS, 2002, vol. 2, pp. II-811-II-814.
(Continued)

*Primary Examiner* — Alexander Talpalatski
*Assistant Examiner* — Joselito Baisa
(74) *Attorney, Agent, or Firm* — Scully, Scott, Murphy & Presser, P.C.; Steven J. Meyers

(57) ABSTRACT

A semiconductor inductor structure may include a first spiral structure, located on a first metal layer, having a first outer-spiral electrically conductive track and a first inner-spiral electrically conductive track separated from the first outer-spiral electrically conductive track by a first dielectric material. A second spiral structure, located on a second metal layer, having a second outer-spiral electrically conductive track and a second inner-spiral electrically conductive track separated from the second outer-spiral electrically conductive track by a second dielectric material may also be provided. The first outer-spiral electrically conductive track may be electrically coupled to the second outer-spiral electrically conductive track and the first inner-spiral electrically conductive track may be electrically coupled to the second inner-spiral electrically conductive track. The first outer-spiral conductive track is laterally offset relative to the second outer-spiral conductive track and the first inner-spiral conductive track is laterally offset relative to the second inner-spiral conductive track.

4 Claims, 15 Drawing Sheets

(51) Int. Cl.
*H01L 49/02* (2006.01)
*H01L 23/522* (2006.01)

(56) References Cited

U.S. PATENT DOCUMENTS

| | | | | |
|---|---|---|---|---|
| 6,762,655 B2 * | 7/2004 | Wichern | ........................ | 333/175 |
| 6,841,847 B2 | 1/2005 | Sia et al. | | |
| 6,894,598 B2 * | 5/2005 | Heima | .......................... | 336/200 |
| 6,940,386 B2 | 9/2005 | Mukherjee et al. | | |
| 6,967,555 B2 * | 11/2005 | Yu et al. | ........................ | 336/200 |
| 7,091,814 B2 * | 8/2006 | Kyriazidou | .......... | H01F 17/0013 257/E21.022 |
| 7,298,238 B1 * | 11/2007 | Eaton | ...................... | H01F 21/12 323/255 |
| 7,504,587 B2 * | 3/2009 | Masu | ...................... | H01P 3/088 174/117 F |
| 7,598,836 B2 * | 10/2009 | Lee | .................... | H01F 17/0013 257/277 |
| 7,633,368 B2 * | 12/2009 | Lee | ................................ | 336/200 |
| 7,705,704 B2 | 4/2010 | Lee et al. | | |
| 7,808,356 B2 | 10/2010 | Papananos | | |
| 7,928,823 B2 * | 4/2011 | Tatsukawa | .......... | H01F 17/0013 29/602.1 |
| 8,178,998 B2 * | 5/2012 | Dellacona | ............... | G05F 1/335 307/104 |
| 8,193,781 B2 * | 6/2012 | Lin | ........................ | H02K 3/26 322/3 |
| 8,581,684 B2 * | 11/2013 | Noire | .................. | H01F 17/0013 336/200 |
| 2005/0157596 A1 * | 7/2005 | Matsumoto | ...... | G11B 11/10534 369/13.02 |
| 2009/0278649 A1 * | 11/2009 | Tatsukawa | .......... | H01F 17/0013 336/200 |
| 2010/0277265 A1 * | 11/2010 | Sturman | ............. | F15B 13/0402 335/267 |

OTHER PUBLICATIONS

A. Zolfaghari et al., "Stacked inductors and transformers in CMOS technology," IEEE Journal of Solid-State Circuits, vol. 36, Issue 4, Apr. 2001, pp. 620-628.

M. López-Villegas et al., "Improvement of the quality factor of RF integrated inductors by layout optimization," IEEE Transactions on Microwave Theory and Techniques, vol. 48, Issue 1, Jan. 2000, pp. 76-83.

T. Ito et al., "Characterization of On-Chip Multiport Inductors for Small-Area RF Circuits," IEEE Transactions on Circuits and Systems I: Regular Papers, vol. 56, Issue 8, Aug. 2009, pp. 1590-1597.

U.S. Appl. No. 13/654,529, filed Oct. 18, 2012, "Folded Conical Inductor".

* cited by examiner

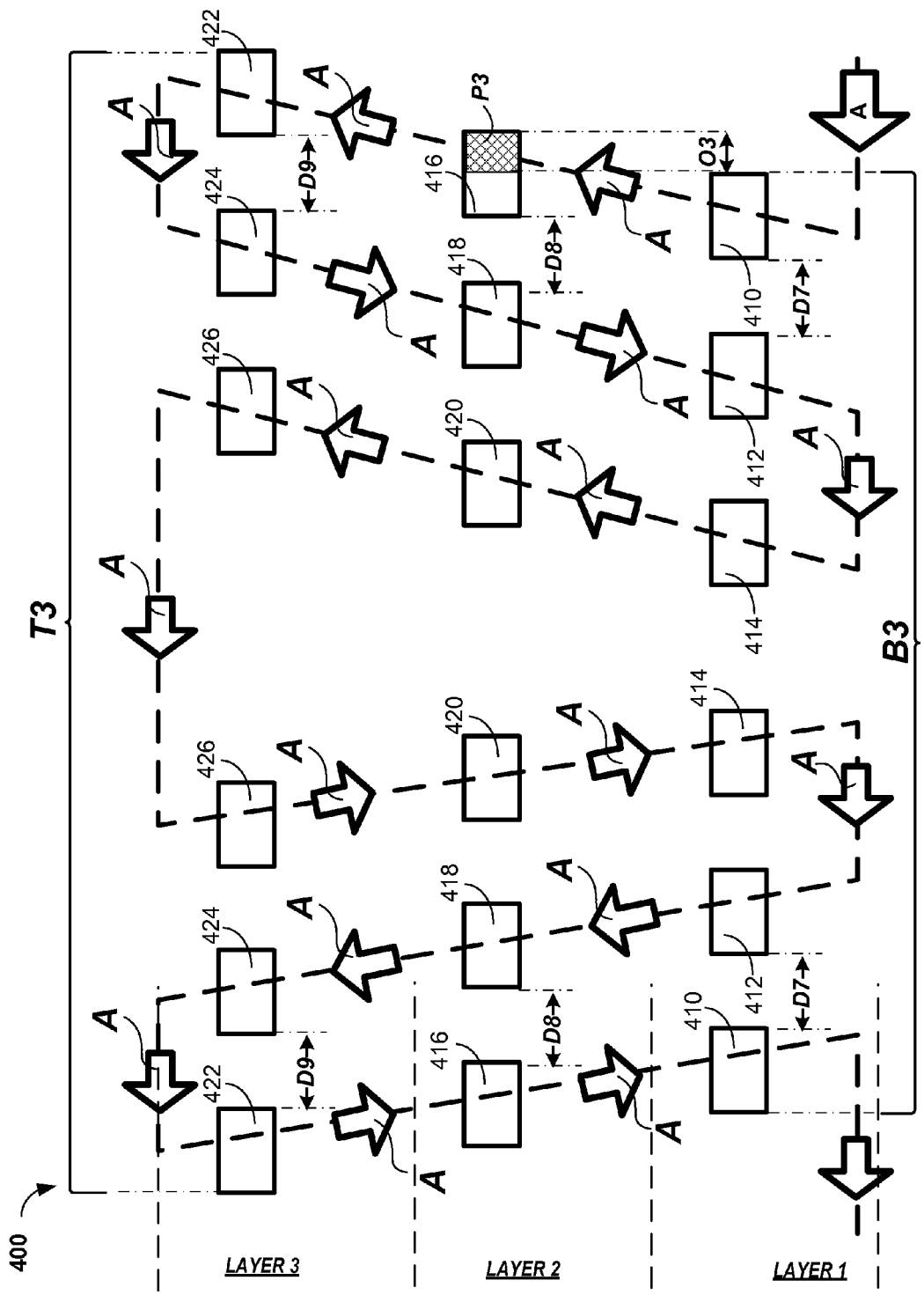

FOLDED CONICAL INDUCTOR

CROSS-REFERENCE TO RELATED APPLICATIONS

The present application is a divisional of and claims priority under 35 U.S.C. §121 of U.S. patent application Ser. No. 13/654,529, filed on Oct. 18, 2012, which is incorporated by reference in its entirety.

BACKGROUND a. Field of the Invention

The present invention generally relates to semiconductor devices, and particularly to on-chip inductor components.

b. Background of Invention

Many communication systems may be realized on a single chip. With an increased demand for personal mobile communications, integrated semiconductor devices such as complementary metal oxide semiconductor (CMOS) devices may, for example, include voltage controlled oscillators (VCO), low noise amplifiers (LNA), tuned radio receiver circuits, or power amplifiers (PA). Each of these tuned radio receiver circuits, VCO, LNA, and PA circuits may, however, require on-chip inductor components in their circuit designs. Thus, there may be a need for high quality on-chip inductor devices.

Several design considerations associated with forming on-chip inductor components may, for example, include quality factor (i.e., Q-factor), self-resonance frequency ($f_{SR}$), and cost considerations impacted by the area occupied by the formed on-chip inductor. Accordingly, for example, a CMOS radio frequency (RF) circuit design may benefit from, among other things, one or more on-chip inductors having a high Q-factor, a small occupied chip area, and a high $f_{SR}$ value.

The self-resonance frequency ($f_{SR}$) of an inductor may be given by the following equation:

$$f_{SR} = \frac{1}{2\pi\sqrt{LC}},$$

where L is the inductance value of the inductor and C may be the capacitance value associated with the inductor coil's inter-winding capacitance, the inductor coil's interlayer capacitance, and the inductor coil's ground plane (i.e., chip substrate) to coil capacitance. As deduced from the above relationship, a reduction in capacitance C may desirably increase the self-resonance frequency ($f_{SR}$) of an inductor. One method of reducing the coil's ground plane to coil capacitance (i.e., metal to substrate capacitance) and, therefore, C value, is by using a high-resistivity semiconductor substrate such as a silicon-on-insulator (SOI) substrate. By having a high resistivity substrate (e.g., >50 Ω-cm), the effect of the coil's metal (i.e., coil tracks) to substrate capacitance is diminished, which in turn may increase the self-resonance frequency ($f_{SR}$) of the inductor.

The Q-factor of an inductor may be given by the equation:

$$Q = \frac{\omega L}{R},$$

where ω is the angular frequency, L is the inductance value of the inductor, and R is the resistance of the coil. As deduced from the above relationship, a reduction in coil resistance may lead to a desirable increase in the inductor's Q-factor. For example, in an on-chip inductor, by increasing the turn-width (i.e., coil track width) of the coil, R may be reduced in favor of increasing the inductors Q-factor to a desired value. In radio communication applications, the Q-factor value is set to the operating frequency of the communication circuit. For example, if a radio receiver is required to operate at 2 GHz, the performance of the receiver circuit may be optimized by designing the inductor to have a peak Q frequency value of about 2 GHz. The self-resonance frequency ($f_{SR}$) and Q-factor of an inductor are directly related in the sense that by increasing $f_{SR}$, peak Q is also increased.

FIG. 1 shows a conventional on-chip stacked inductor 100, as known in the art. The depicted on-chip stacked inductor 100 may be fabricated on, for example, two metal layers 102, 104 corresponding to the back end of the line (BEOL) region of a semiconductor device. A first spiral structure 106 (i.e., a coil) is formed in metal layer 104, while a second spiral structure 108 (i.e., a coil) is formed in metal layer 102. The first spiral structure 106 is electrically coupled to the second spiral structure 108 by via 109, whereby the lower portion of the via 110a connects the first spiral structure 106 to the second spiral structure 108 by means of the upper portion of the via 110b.

In operation, as illustrated, current may flow along the direction of the arrows from input 112 of the second spiral structure 108 to output 114 of the first spiral structure 106. As such, current entering at input 112 flows in a counter-clockwise direction from the outer-most-spiral track 116 to the inner-most-spiral track 118 of the second spiral structure 108. At the end of the inner-most-spiral track 118, current flows into the upper portion of the via 110b and out of the lower portion of the via 110a. From the lower portion of the via 110a, the current continues to flow in a counter-clockwise direction from the inner-most-spiral track 120 to output 114 of the outer-most-spiral track 122 of first spiral structure 106. The positive mutual inductive coupling between the first spiral 106 and second spiral 108 leads to a total inductance greater than the simple sum of the inductances of the two spirals taken by themselves. For example, a two layer spiral may experience as much as four times the inductance of the two layers taken separately and summed.

The depicted on-chip stacked inductor 100 structure exhibits an increased interlayer capacitance between the metal tracks of first spiral 106 and second spiral 108. This increased capacitance contributes towards reducing both the Q-factor and self-resonance frequency ($f_{SR}$) of on-chip stacked inductor 100. Thus, it may, among other things, be advantageous to provide one or more on-chip inductor structures capable of having an increased Q-factor and self-resonance frequency ($f_{SR}$), while maintaining a reduced footprint (i.e., smaller occupied area) with respect to the metal layers of the BEOL region of a semiconductor device.

BRIEF SUMMARY

According to at least one exemplary embodiment, a semiconductor inductor structure may include a first spiral structure, located on a first metal layer, having a first outer-spiral electrically conductive track and a first electrically conductive inner-spiral track separated from the first outer-spiral electrically conductive track by a first dielectric material. A second spiral structure, located on a second metal layer, and separated from the first metal layer by an interlayer dielectric material, having a second outer-spiral electrically conductive track and a second electrically conductive inner-spiral track separated from the second outer-spiral electrically conductive track by a second dielectric material may also be provided.

The first outer-spiral electrically conductive track may be electrically coupled to the second outer-spiral electrically conductive track and the first inner-spiral electrically conductive track may be electrically coupled to the second inner-spiral electrically conductive track. The second outer-spiral electrically conductive track may also be electrically coupled to the second inner-spiral electrically conductive track. The first outer-spiral electrically conductive track is laterally offset relative to the second outer-spiral electrically conductive track and the first inner-spiral electrically conductive track is laterally offset relative to the second inner-spiral electrically conductive track.

According to at least one other exemplary embodiment, a method of forming a semiconductor inductor structure may include forming, on a first metal layer, a first outer-spiral electrically conductive track and a first electrically conductive inner-spiral track adjacent to the first outer-spiral electrically conductive track. On a second metal layer, and separated from the first metal layer by an interlayer dielectric material, a second outer-spiral electrically conductive track and a second electrically conductive inner-spiral track adjacent to the second outer-spiral electrically conductive track may be formed. The first outer-spiral electrically conductive track is electrically coupled to the second outer-spiral electrically conductive track and the second inner-spiral electrically conductive track is electrically coupled to the first inner-spiral electrically conductive track. Also, the second outer-spiral electrically conductive track is electrically coupled to the second inner-spiral electrically conductive track. The first outer-spiral electrically conductive track is laterally offset relative to the second outer-spiral electrically conductive track and the first inner-spiral electrically conductive track is laterally offset relative to the second inner-spiral electrically conductive track.

According to at least one other exemplary embodiment, a semiconductor inductor structure may include a first spiral structure, located on a first metal layer, having a first spiral electrically conductive track and a first electrically conductive inner-spiral track separated from the first outer-spiral electrically conductive track by a first dielectric material. A second spiral structure, located on a second metal layer and separated from the first metal layer by an interlayer dielectric material, having a second spiral electrically conductive track is also included, whereby the first outer-spiral electrically conductive track is electrically coupled to an input of the second spiral electrically conductive track and the first inner-spiral electrically conductive track is electrically coupled to an output of the second spiral electrically conductive track. The second spiral electrically conductive track may include non-overlapping conductive regions with both the first inner-spiral electrically conductive track and the first outer-spiral electrically conductive track.

According to at least one other exemplary embodiment, a design structure tangibly embodied in a machine readable medium for designing, manufacturing, or testing an integrated circuit is provided. The design structure may include a first spiral structure, located on a first metal layer, having a first spiral electrically conductive track and a first electrically conductive inner-spiral track separated from the first outer-spiral electrically conductive track by a first dielectric material. A second spiral structure, located on a second metal layer and separated from the first metal layer by an interlayer dielectric material, having a second spiral electrically conductive track is also included, whereby the first outer-spiral electrically conductive track is electrically coupled to an input of the second spiral electrically conductive track and the first inner-spiral electrically conductive track is electrically coupled to an output of the second spiral electrically conductive track. The second spiral electrically conductive track may include non-overlapping conductive regions with both the first inner-spiral electrically conductive track and the first outer-spiral electrically conductive track.

BRIEF DESCRIPTION OF THE SEVERAL VIEWS OF THE DRAWINGS

FIG. 7C is a cross-sectional view of the metallic tracks corresponding to the on-chip inductor structure of FIG. 4;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following described exemplary embodiments are directed to on-chip inductor components formed on a high resistivity silicon-on-insulator (SOI) substrate. The resistivity of the SOI substrate may be greater than 50 Ω-cm and, preferably, 1000 Ω-cm or more. The structure of the inductor embodiments may be formed as a folded conical shape (see FIGS. 2-4), whereby the electrical current (I) path within the inductor traverses in both an upward and downward direction through the metal layers (i.e., folded structure) while travelling along spiral paths having a progressively decreasing and/or increasing radius (i.e., conical structure).

Figure 2:
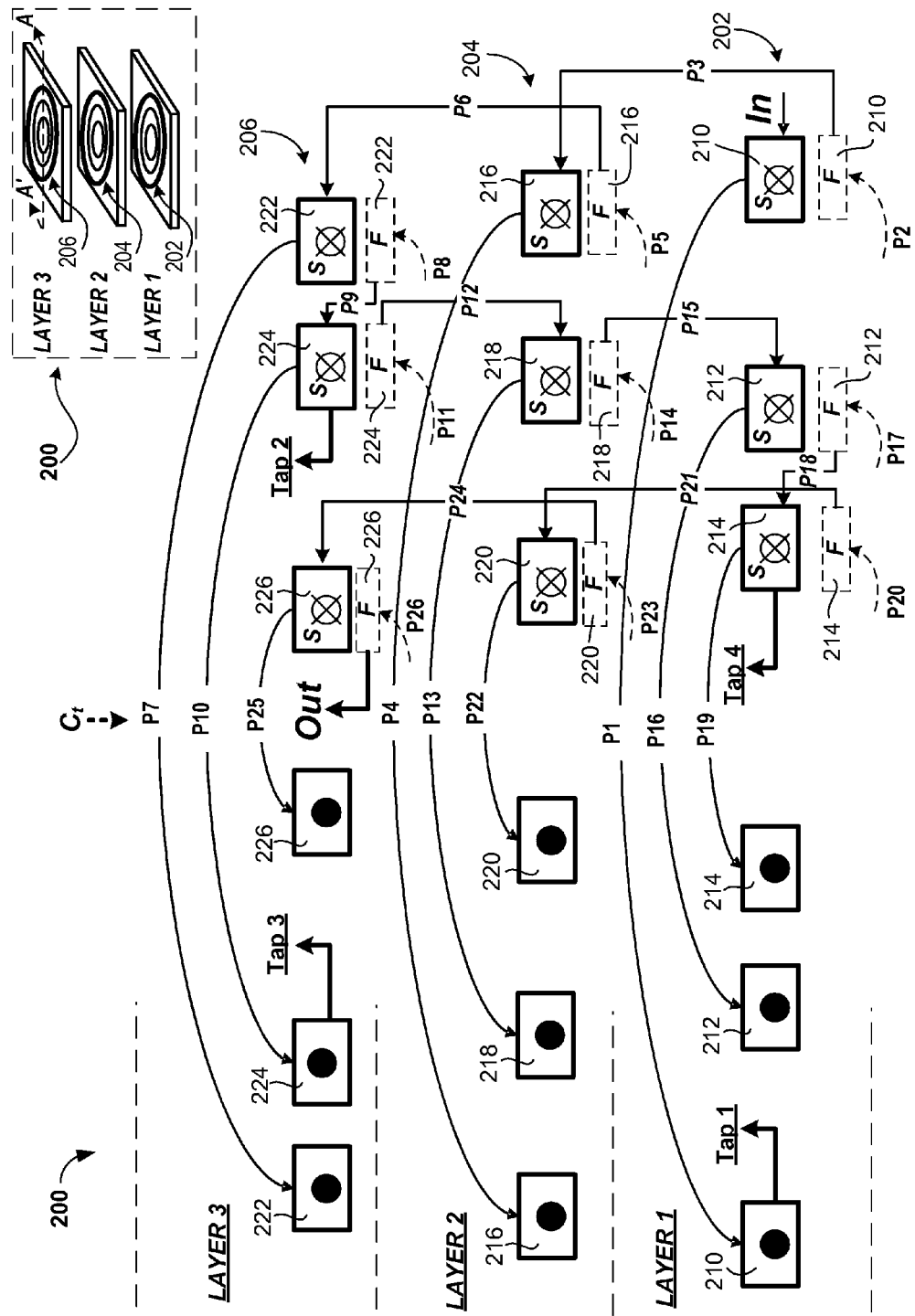
FIG. 2 is a cross-sectional view of an on-chip inductor structure according to one embodiment of the invention.

FIG. 2 illustrates a cross-sectional view along axis A-A' of a semiconductor on-chip inductor structure 200 according to an exemplary embodiment. As depicted, inductor structure 200 may be formed within three metal layers of a semiconductor device, although the use of more or less metal layers for the purpose of fabricating an on-chip inductor may also be contemplated.

Particularly, metal layer 1 includes spiral structure 202, metal layer 2 includes spiral structure 204, and metal layer 3 includes spiral structure 206. As illustrated by the cross-sectional view, spiral structure 202 within layer 1 may include outer-spiral track 210, intermediate-spiral track 212, and inner-spiral track 214, whereby each of the spiral tracks may be constructed from an electrically conductive material such as, for example, copper, tungsten, or aluminum. Also, spiral structure 204 within layer 2 may include outer-spiral track 216, intermediate-spiral track 218, and inner-spiral track 220, whereby each of these spiral tracks may be constructed from an electrically conductive material such as, for example, copper, tungsten, or aluminum. Spiral structure 206 within layer 3 may include outer-spiral track 222, intermediate-spiral track 224, and inner-spiral track 226, whereby each of these spiral tracks may also be constructed from an electrically conductive material such as, for example, copper, tungsten, or aluminum.

The above-described spiral tracks may be lithographically formed (i.e., photolithography and etching) on the metal layers of a semiconductor device, whereby upon the deposition of an interlayer dielectric (ILD) material over each metal layer, both laterally and vertically adjacent spiral tracks are insulted by the ILD material. However, vertically adjacent isolated spiral tracks may be electrically coupled using one or more via connections, while laterally adjacent isolated spiral tracks may be electrically coupled using electrical conductors (e.g., copper tracks). As described in the following paragraphs, the via connections and electrical conductors may be used to electrically couple the various spiral tracks of the inductor structure 200 that exist both within and on the different metal layers. The thickness of the spiral tracks may be limited to the metal layer thicknesses while the width of the spiral tracks may be designed to range from approximately 1-50 μm, preferably between about 1-10 μm. Metal layer 1 may be about 3 μm, metal layer 2 may be about 6 μm, and metal layer 3 may be approximately 4 μm, however, different layer thicknesses may be contemplated depending on the choice of semiconductor technology.

Also, within each metal layer, as the spiral tracks reduce in radius towards the center of the spiral structure (depicted by $C_t$), their corresponding track width may be reduced (not shown). This reduction in width as the track radius approaches $C_t$ may be intended to optimally utilize the track cross-sectional area where the highest current density flows. The track current tends to flow on one side or the other of spiral tracks under the influence of high magnetic fields as seen near $C_t$ due to interaction with the magnetic fields of adjacent tracks both vertically and horizontally (commonly referred to as proximity effect). Removing track sections containing little current density reduces parasitic capacitance, increasing $f_{sr}$ and peak Q, while not increasing series resistance at high frequencies. For example, within layer 1, the track width of inner-spiral track 214 may be reduced relative to the track width of intermediate-spiral track 212 and the track width of intermediate-spiral track 212 may be reduced relative to the track width of outer-spiral track 210. The reduction of track width addresses an increase in proximity effect as the spiral tracks become closer (e.g., track 214) to the center of spiral structure $C_t$. Similarly, within layer 2, the track width of inner-spiral track 220 may be reduced relative to the track width of intermediate-spiral track 218, while the track width of intermediate-spiral track 218 may be reduced relative to the track width of outer-spiral track 216. The reduction of track width addresses an increase in proximity effect as the spiral tracks become closer (e.g., track 220) to the center of spiral structure $C_t$. Also, within layer 3, the track width of inner-spiral track 226 may be reduced relative to the track width of intermediate-spiral track 224, and the track width of intermediate-spiral track 224 may be reduced relative to the track width of outer-spiral track 222. The reduction of track width addresses an increase in proximity effect as the spiral tracks become closer (e.g., track 226) to the center of spiral structure $C_t$.

The following paragraphs describe the structural details and electrical connectivity between the spiral structures 202, 204, 206 of the inductor structure 200. Subsequently, an operational flow of current through inductor structure 200 will be described. It may also be noted that the following description of spiral structures 202, 204, and 206 refer to a start point (S) and end point (F) for each spiral track. The start point (S) may signify the position on the track where electrical current enters as either an inductor component input (e.g., see FIG. 2: spiral track 210, In) or enters as an electrical current output from another spiral track (e.g., see FIG. 2: spiral track 216, S). The end point (F) may signify a position on the track where electrical current exits as either an inductor component output (e.g., FIG. 2: spiral track 226, Out) or exits as an electrical current that may be input to another adjacent spiral track (e.g., see FIG. 2: spiral track 210, F). Also, from a structural perspective, the start point (S) may indicate where the spiral track physically starts while the end point (F) may accordingly indicate where the spiral track ends.

Within layer 1, as indicated by the numbered arrows, the outer-spiral track 210 extends one half-turn along path P1 and returns back along the remaining half-turn denoted by path P2. For illustrative clarity, return path P2 is shown by a dotted arrow denoting only the last portion of the return path of the outer-spiral track 210 back to where outer-spiral track 210 started along path P1. The start of outer-spiral track 210 along path P1 is defined by S and the return of outer-spiral track 210 after approximately a full turn is defined by F. Thus, as depicted, the start point S of the outer-spiral track 210 is electrically isolated from the end point F of the outer-spiral track 210. At point F, the end portion of the outer-spiral track 210 electrically couples to outer-spiral track 216 within layer 2 of the inductor structure 200 along path P3, whereby such inter-layer electrical coupling (i.e., between layers 1 & 2) may be provided by an electrically conductive via (not shown). Point S of the outer-spiral track 210 may be designated as the inductor structure 200 input (In).

Similarly, the intermediate-spiral track 212 of layer 1 extends one half-turn along path P16 and returns back along the remaining half-turn denoted by path P17. For illustrative clarity, return path P17 is shown by a dotted arrow denoting only the last portion of the return path of the intermediate-spiral track 212 back to where intermediate-spiral track 212 started along path P16. The start of intermediate-spiral track 212 along path P16 is defined by S and the return of intermediate-spiral track 212 after approximately a full turn is defined by F. Thus, as depicted, the start point S of the intermediate-spiral track 212 is electrically isolated from the end point F of the intermediate-spiral track 212. At point F, the end portion of the intermediate-spiral track 212 electrically couples to inner-spiral track 214, within layer 1, along path P18. Also, at point S, the start portion of the intermediate-spiral track 212 electrically couples to intermediate-spiral track 218 within layer 2 of the inductor structure 200 along path P15, whereby such inter-layer electrical coupling may be provided by an electrically conductive via (not shown).

Also within layer 1, the inner-spiral track 214 extends one half-turn along path P19 and returns back along the remaining half-turn denoted by path P20. For illustrative clarity, return path P20 is shown by a dotted arrow denoting only the last portion of the return path of the inner-spiral track 214 back to where inner-spiral track 214 started along path P19. The start of inner-spiral track 214 along path P19 is defined by S and the return of inner-spiral track 214 after approximately a full turn is defined by F. Thus, as depicted, the start point S of the inner-spiral track 214 is electrically isolated from the end point F of the inner-spiral track 214. At point F, the end portion of the inner-spiral track 214 electrically couples to inner-spiral track 220 within layer 2 of the inductor structure 200 along path P21, whereby such inter-layer electrical coupling may be provided by an electrically conductive via (not shown). At point S, the start portion of the inner-spiral track 214 electrically couples to intermediate-spiral track 212, within layer 1, along path P18.

Within layer 2, as indicated by the numbered arrows, the outer-spiral track 216 extends one half-turn along path P4 and returns back along the remaining half-turn denoted by path P5. For illustrative clarity, return path P5 is shown by a dotted arrow denoting only the last portion of the return path of the outer-spiral track 216 back to where outer-spiral track 216 started along path P4. The start of outer-spiral track 216 along path P4 is defined by S and the return of outer-spiral track 216 after approximately a full turn is defined by F. Thus, as depicted, the start point S of the outer-spiral track 216 is electrically isolated from the end point F of the outer-spiral track 216. At point F, the end portion of the outer-spiral track 216 electrically couples to outer-spiral track 222 within layer 3 of the inductor structure 200 along path P6, whereby such inter-layer electrical coupling (i.e., between layers 2 & 3) may be provided by an electrically conductive via (not shown). At point S, the start portion of the outer-spiral track 216 electrically couples to outer-spiral track 210 within layer 1 of the inductor structure 200 along path P3, whereby such inter-layer electrical coupling (i.e., between layers 1 & 2) may be provided by an electrically conductive via (not shown).

Similarly, the intermediate-spiral track 218 of layer 2 extends one half-turn along path P13 and returns back along the remaining half-turn denoted by path P14. For illustrative clarity, return path P14 is shown by a dotted arrow denoting only the last portion of the return path of the intermediate-spiral track 218 back to where intermediate-spiral track 218 started along path P13. The start of intermediate-spiral track 218 along path P13 is defined by S and the return of intermediate-spiral track 218 after approximately a full turn is defined by F. Thus, as depicted, the start point S of the intermediate-spiral track 218 is electrically isolated from the end point F of the intermediate-spiral track 218. At point F, the end portion of the intermediate-spiral track 218 electrically couples to intermediate-spiral track 212 of layer 1 along path P15. Also, at point S, the start portion of the intermediate-spiral track 218 electrically couples to intermediate-spiral track 224 within layer 3 of the inductor structure 200 along path P12. The inter-layer electrical coupling between the intermediate-spiral track 218 of layer 2 and the intermediate-spiral tracks 212, 224 of layers 1 and 2 may be provided by electrically conductive vias (not shown).

Also within layer 2, the inner-spiral track 220 extends one half-turn along path P22 and returns back along the remaining half-turn denoted by path P23. For illustrative clarity, return path P23 is shown by a dotted arrow denoting only the last portion of the return path of the inner-spiral track 220 back to where inner-spiral track 220 started along path P22. The start of inner-spiral track 220 along path P22 is defined by S and the return of inner-spiral track 220 after approximately a full turn is defined by F. Thus, as depicted, the start point S of the inner-spiral track 220 is electrically isolated from the end point F of the inner-spiral track 220. At point F, the end portion of the inner-spiral track 220 electrically couples to inner-spiral track 226 within layer 3 of the inductor structure 200 along path P24, whereby such inter-layer electrical coupling may be provided by an electrically conductive via (not shown). At point S, the start portion of the inner-spiral track 220 electrically couples to inner-spiral track 214 of layer 1 along path P21, whereby such inter-layer electrical coupling may also be provided by an electrically conductive via (not shown).

Within layer 3, as indicated by the numbered arrows, the outer-spiral track 222 extends one half-turn along path P7 and returns back along the remaining half-turn denoted by path P8. For illustrative clarity, return path P8 is shown by a dotted arrow denoting only the last portion of the return path of the outer-spiral track 222 back to where outer-spiral track 222 started along path P7. The start of outer-spiral track 222 along path P7 is defined by S and the return of outer-spiral track 222 after approximately a full turn is defined by F. Thus, as depicted, the start point S of the outer-spiral track 222 is electrically isolated from the end point F of the outer-spiral track 222. At point F, the end portion of the outer-spiral track 222 electrically couples to intermediate-spiral track 224 within layer 3 of the inductor structure 200 along path P9. At point S, the start portion of the outer-spiral track 222 electrically couples to outer-spiral track 216 within layer 2 of the inductor structure 200 along path P6.

Similarly, the intermediate-spiral track 224 of layer 3 extends one half-turn along path P10 and returns back along the remaining half-turn denoted by path P11. For illustrative clarity, return path P11 is shown by a dotted arrow denoting only the last portion of the return path of the intermediate-spiral track 224 back to where intermediate-spiral track 224 started along path P10. The start of intermediate-spiral track 224 along path P10 is defined by S and the return of intermediate-spiral track 224 after approximately a full turn is defined by F. Thus, as depicted, the start point S of the intermediate-spiral track 224 is electrically isolated from the end point F of the intermediate-spiral track 224. At point F, the end portion of the intermediate-spiral track 224 electrically couples to intermediate-spiral track 218 of layer 2 along path P12, whereby such inter-layer electrical coupling may be provided by an electrically conductive via (not shown). At point S, the start portion of the intermediate-spiral track 224 electrically couples to outer-spiral track 222 within the same layer along path P9, whereby such inter-spiral electrical coupling may be provided by an electrical connection (not shown).

Also within layer 3, the inner-spiral track 226 extends one half-turn along path P25 and returns back along the remaining half-turn denoted by path P26. For illustrative clarity, return path P26 is shown by a dotted arrow denoting only the last portion of the return path of the inner-spiral track 226 back to where inner-spiral track 226 started along path P25. The start of inner-spiral track 226 along path P25 is defined by S and the return of inner-spiral track 226 after approximately a full turn is defined by F. Thus, as depicted, the start point S of the inner-spiral track 226 is electrically isolated from the end point F of the inner-spiral track 226. Point F of the inner-spiral track 226 may be designated as the inductor structure 200 output (Out). At point S, the start portion of the inner-spiral track 226 electrically couples to inner-spiral track 220 of layer 2 along path P24, whereby such inter-layer electrical coupling may be provided by an electrically conductive via (not shown).

As shown in FIG. 2, the turn radius of the outer-spiral 210 on layer 1 is larger than the turn radius of the outer-spiral 216 on layer 2. Also, the turn radius of the outer-spiral 216 on layer 2 is larger than the turn radius of the outer-spiral 222 on layer 3. Thus, the turn radiuses of the outer-spiral tracks 210, 216, 222 progressively reduce from layer 1 through to layer 3.

Similarly, the turn radius of the intermediate-spiral 224 on layer 3 is larger than the turn radius of the intermediate-spiral 218 on layer 2. Also, the turn radius of the intermediate-spiral 218 on layer 2 is larger than the turn radius of the intermediate-spiral 212 on layer 1. Thus, the turn radiuses of the intermediate-spiral tracks 224, 218, 212 progressively reduce from layer 3 through to layer 1.

Also, the turn radius of the inner-spiral 214 on layer 1 is larger than the turn radius of the inner-spiral 220 on layer 2. Also, the turn radius of the inner-spiral 220 on layer 2 is larger than the turn radius of the inner-spiral 226 on layer 3. Thus, the turn radiuses of the inner-spiral tracks 214, 220, 226 progressively reduce from layer 1 through to layer 3.

The foregoing described relationship between the radiuses of the spiral tracks enable the electrical current to follow a substantially conical path, whereby as the current is input (In) to the inductor structure 200 at spiral track 210 (i.e., point S), the current path progressively propagates along spiral tracks of reducing radius until the current reaches the output (Out) of the inductor structure 200 at spiral track 226 (i.e., point F). Further, the electrical current propagates throughout layers 1, 2, and 3 multiple times, as does a folded inductor structure. Further, details of the electrical current flow within inductor structure 200 are provided in the following paragraphs.

Referring to FIG. 2, the electrical current flow follows the depicted sequence indicated by paths P1-P26. As illustrated, electrical current may be received by the inductor component 200 at point S (i.e., In) of outer-spiral track 210 within layer 1. The current flows, from point S, in a counter-clockwise direction along paths P1 and P2 back to point F of the outer-spiral track 210. Thus, the current flows approximately a full turn on the outer-spiral track 210. At point F of outer-spiral track 210, a via connection may electrically couple the outer-spiral track 210 of layer 1 to the outer-spiral track 216 of layer 2 along path P3.

From path P3, electrical current may be received at point S of outer-spiral track 216 within layer 2. The current flows, from point S, in a counter-clockwise direction along paths P4 and P5 back to point F of the outer-spiral track 216. Thus, the current flows approximately a full turn on the outer-spiral track 216. At point F of outer-spiral track 216, a via connection may electrically couple outer-spiral track 216 of layer 2 to outer-spiral track 222 of layer 3 along path P6.

From path P6, electrical current may be received at point S of outer-spiral track 222 within layer 3. The current flows, from point S, in a counter-clockwise direction along paths P7 and P8 back to point F of the outer-spiral track 222. Thus, the current flows approximately a full turn on the outer-spiral track 222. At point F of outer-spiral track 222, an electrical connection may couple outer-spiral track 222 of layer 3 to intermediate-spiral track 224 within the same layer (i.e., layer 3) along path P9. Accordingly, as described, current flows in the outer-spiral track of each layer before propagating within the next inner track (e.g., intermediate-spiral) of each layer.

From path P9, electrical current may be received at point S of intermediate-spiral track 224 within layer 3. The current flows, from point S, in a counter-clockwise direction along paths P10 and P11 back to point F of the intermediate-spiral track 224. Thus, the current flows approximately a full turn on the outer-spiral track 224. At point F of intermediate-spiral track 224, a via connection may electrically couple intermediate-spiral track 224 of layer 3 to intermediate-spiral track 218 of layer 2 along path P12.

From path P12, electrical current may be received at point S of intermediate-spiral track 218 within layer 2. The current flows, from point S, in a counter-clockwise direction along paths P13 and P14 back to point F of the intermediate-spiral track 218. Thus, the current flows approximately a full turn on the intermediate-spiral track 218. At point F of intermediate-spiral track 218, a via connection may electrically couple intermediate-spiral track 218 of layer 2 to intermediate-spiral track 212 of layer 1 along path P15.

From path P15, electrical current may be received at point S of intermediate-spiral track 212 within layer 1. The current flows, from point S, in a counter-clockwise direction along paths P16 and P17 back to point F of the intermediate-spiral track 212. Thus, the current flows approximately a full turn on the intermediate-spiral track 212. At point F of intermediate-spiral track 212, an electrical connection may couple intermediate-spiral track 212 of layer 1 to inner-spiral track 214 within the same layer (i.e., layer 1) along path P18. Accordingly, as described, current flows in the intermediate-spiral track of each layer before propagating within the next inner track (e.g., inner-spiral) of each layer.

From path P18, electrical current may be received at point S of inner-spiral track 214 within layer 1. The current flows, from point S, in a counter-clockwise direction along paths P19 and P20 back to point F of the inner-spiral track 214. Thus, the current flows approximately a full turn on the inner-spiral track 214. At point F of inner-spiral track 214, a via connection may electrically couple inner-spiral track 214 of layer 1 to inner-spiral track 220 of layer 2 along path P21.

From path P21, electrical current may be received at point S of inner-spiral track 220 within layer 2. The current flows, from point S, in a counter-clockwise direction along paths P22 and P23 back to point F of the inner-spiral track 220. Thus, the current flows approximately a full turn on the inner-spiral track 220. At point F of inner-spiral track 220, a via connection may electrically couple inner-spiral track 220 of layer 2 to inner-spiral track 226 of layer 3 along path P24.

From path P24, electrical current may be received at point S of inner-spiral track 226 within layer 3. The current flows, from point S, in a counter-clockwise direction along paths P25 and P26 back to point F of the inner-spiral track 226. Thus, the current flows approximately a full turn on the inner-spiral track 226. At point F of inner-spiral track 226, an electrical connection (i.e., labeled Out) may couple inner-spiral track 226 of layer 3 to other components on the chip. Accordingly, as described, current flows in the inner-spiral track of each layer before being output from the inductor structure 200.

Although each spiral track of each metal layer is about one single full turn, a spiral track with multiple turns may also be contemplated. For example, outer-spiral track 210 is about a full turn within metal layer 1. However, according to other embodiments, outer-spiral track 210 may undergo multiple turns (i.e., two or more) before electrically coupling to outer-spiral track 216 by means of path P3.

Figure 1:
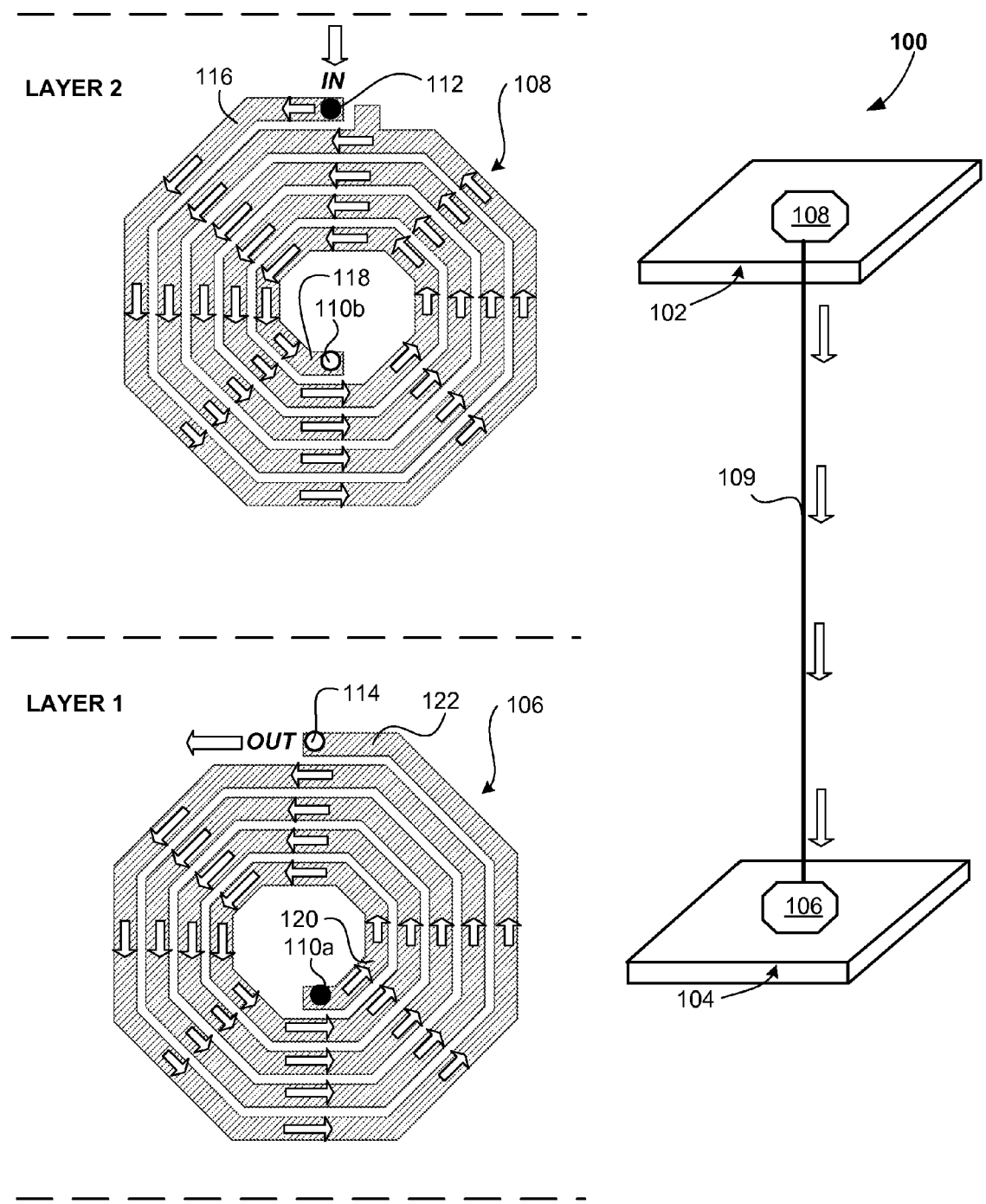
FIG. 1 is plan view of an on-chip stacked inductor structure, as known in the art.

In contrast with a stacked inductor (e.g., see FIG. 1), the exemplary inductor structure 200 of FIG. 2 includes a folded structure, whereby the current propagates approximately a single full turn within each metal layer before transitioning to the next adjacent metal layer. In contrast, within a stacked inductor, the current propagates along the entire spiral path of a metal layer before transitioning to the next metal layer. The net effect of the folded structure is a reduction in capacitance caused by the metal-to-metal capacitance between the spiral tracks of each metal layer. The equivalent circuit of a folded inductor structure may yield a metal-to-metal capacitance between the spiral tracks that are in series. Thus, the net value of the series capacitance yields a reduced capacitance value based on the series formation. The equivalent circuit of a stacked inductor structure may, however yield a metal-to-metal capacitance between the spiral tracks that are in parallel. Thus, the net value of the parallel capacitance yields an increased capacitance value based on the parallel formation.

Figure 3:
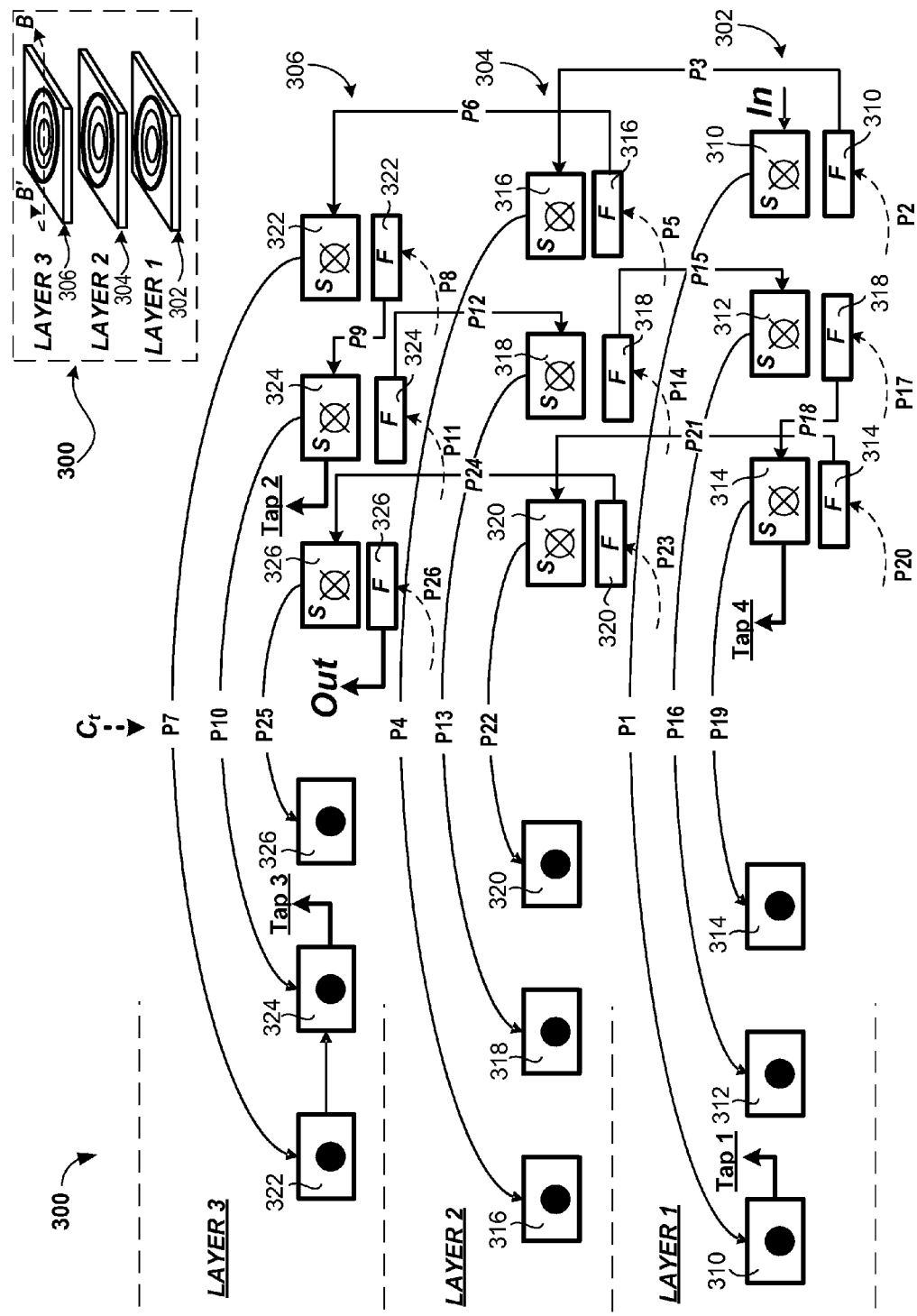
FIG. 3 is a cross-sectional view of an on-chip inductor structure according to another embodiment of the invention.

FIG. 3 illustrates a cross-sectional view along axis B-B' of a semiconductor on-chip inductor structure 300 according to an exemplary embodiment. As depicted, inductor structure 300 may be formed within three metal layers of a semiconductor device, although the use of more or less metal layers for the purpose of fabricating an on-chip inductor may also be contemplated.

Particularly, metal layer 1 includes spiral structure 302, metal layer 2 includes spiral structure 304, and metal layer 3 includes spiral structure 306. As illustrated by the cross-sectional view, spiral structure 302 within layer 1 may include outer-spiral track 310, intermediate-spiral track 312, and inner-spiral track 314, whereby each of the spiral tracks may be constructed from an electrically conductive material such as, for example, copper, tungsten, or aluminum. Also, spiral structure 304 within layer 2 may include outer-spiral track 316, intermediate-spiral track 318, and inner-spiral track 320, whereby each of these spiral tracks may be constructed from an electrically conductive material such as, for example, copper, tungsten, or aluminum. Spiral structure 306 within layer 3 may include outer-spiral track 322, intermediate-spiral track 324, and inner-spiral track 326, whereby each of these spiral tracks may also be constructed from an electrically conductive material such as, for example, copper, tungsten, or aluminum.

The above-described spiral tracks may be lithographically formed (i.e., photolithography and etching) on the metal layers of a semiconductor device, whereby upon the deposition of an interlayer dielectric (ILD) material over each metal layer, both laterally and vertically adjacent spiral tracks are insulted by the ILD material. However, vertically adjacent isolated spiral tracks may be electrically coupled using one or more via connections, while laterally adjacent isolated spiral tracks may be electrically coupled using electrical conductors (e.g., copper tracks). As described in the following paragraphs, the via connections and electrical conductors may be used to electrically couple the various spiral tracks of the inductor structure 300 that exist both within and on the different metal layers. The thickness of the spiral tracks may be limited to the metal layer thicknesses while the width of the spiral tracks may be designed to range from approximately 1-50 μm, preferably between about 1-10 μm. Metal layer 1 may be about 3 μm, metal layer 2 may be about 6 μm, and metal layer 3 may be approximately 4 μm, however, different layer thicknesses are contemplated depending on the choice of semiconductor technology.

Also, within each metal layer, as the spiral tracks reduce in radius towards the center of the spiral structure (depicted by $C_t$), their corresponding track width may be reduced (not shown). This reduction in width as the track radius approaches $C_t$ may be intended to optimally utilize the track cross-sectional area where the highest current density flows. The track current tends to flow on one side or the other of spiral tracks under the influence of high magnetic fields as seen near $C_t$ due to interaction with the magnetic fields of adjacent tracks both vertically and horizontally (commonly referred to as proximity effect). Removing track sections containing little current density reduces parasitic capacitance, increasing $f_{sr}$ and peak Q, while not increasing series resistance at high frequencies. For example, within layer 1, the track width of inner-spiral track 314 may be reduced relative to the track width of intermediate-spiral track 312 and the track width of intermediate-spiral track 312 may be reduced relative to the track width of outer-spiral track 310. The reduction of track width addresses an increase in proximity effect as the spiral tracks become closer (e.g., track 314) to the center of spiral structure $C_t$. Similarly, within layer 2, the track width of inner-spiral track 320 may be reduced relative to the track width of intermediate-spiral track 318, while the track width of intermediate-spiral track 318 may be reduced relative to the track width of outer-spiral track 316. The reduction of track width addresses an increase in proximity effect as the spiral tracks become closer (e.g., track 320) to the center of spiral structure $C_t$. Also, within layer 3, the track width of inner-spiral track 326 may be reduced relative to the track width of intermediate-spiral track 324, and the track width of intermediate-spiral track 324 may be reduced relative to the track width of outer-spiral track 322. The reduction of track width addresses an increase in proximity effect as the spiral tracks become closer (e.g., track 326) to the center of spiral structure $C_t$.

The following paragraphs describe the structural details and electrical connectivity between the spiral structures 302, 304, 306 of the inductor structure 300. Subsequently, an operational flow of current through inductor structure 300 will be described. It may also be noted that the following description of spiral structures 302, 304, and 306 refer to a start point (S) and end point (F) for each spiral track. The start point (S) may signify the position on the track where electrical current enters as either an inductor component input (e.g., see FIG. 3: spiral track 310, In) or enters as an electrical current output from another spiral track (e.g., see FIG. 3: spiral track 316, S). The end point (F) may signify a position on the track where electrical current exits as either an inductor component output (e.g., FIG. 3: spiral track 326, Out) or exits as an electrical current that may be input to another adjacent spiral track (e.g., see FIG. 3: spiral track 310, F). Also, from a structural perspective, the start point (S) may indicate where the spiral track physically starts while the end point (F) may accordingly indicate where the spiral track ends.

Within layer 1, as indicated by the numbered arrows, the outer-spiral track 310 extends one half-turn along path P1 and returns back along the remaining half-turn denoted by path P2. For illustrative clarity, return path P2 is shown by a dotted arrow denoting only the last portion of the return path of the outer-spiral track 310 back to where outer-spiral track 310 started along path P1. The start of outer-spiral track 310 along path P1 is defined by S and the return of outer-spiral track 310 after approximately a full turn is defined by F. Thus, as depicted, the start point S of the outer-spiral track 310 is electrically isolated from the end point F of the outer-spiral track 310. At point F, the end portion of the outer-spiral track 310 electrically couples to outer-spiral track 316 within layer 2 of the inductor structure 300 along path P3, whereby such inter-layer electrical coupling (i.e., between layers 1 & 2) may be provided by an electrically conductive via (not shown). Point S of the outer-spiral track 310 may be designated as the inductor structure 300 input (In).

Similarly, the intermediate-spiral track 312 of layer 1 extends one half-turn along path P16 and returns back along the remaining half-turn denoted by path P17. For illustrative clarity, return path P17 is shown by a dotted arrow denoting only the last portion of the return path of the intermediate-spiral track 312 back to where intermediate-spiral track 312 started along path P16. The start of intermediate-spiral track 312 along path P16 is defined by S and the return of intermediate-spiral track 312 after approximately a full turn is defined by F. Thus, as depicted, the start point S of the intermediate-spiral track 312 is electrically isolated from the end point F of the intermediate-spiral track 312. At point F, the end portion of the intermediate-spiral track 312 electrically couples to inner-spiral track 314, within layer 1, along path P18. Also, at point S, the start portion of the intermediate-spiral track 312 electrically couples to intermediate-spiral track 318 within layer 2 of the inductor structure 300 along path P15, whereby such inter-layer electrical coupling may be provided by an electrically conductive via (not shown).

Also within layer 1, the inner-spiral track 314 extends one half-turn along path P19 and returns back along the remaining half-turn denoted by path P20. For illustrative clarity, return path P20 is shown by a dotted arrow denoting only the last portion of the return path of the inner-spiral track 314 back to where inner-spiral track 314 started along path P19. The start of inner-spiral track 314 along path P19 is defined by S and the return of inner-spiral track 314 after approximately a full turn is defined by F. Thus, as depicted, the start point S of the inner-spiral track 314 is electrically isolated from the end point F of the inner-spiral track 314. At point F, the end portion of the inner-spiral track 314 electrically couples to inner-spiral track 320 within layer 2 of the inductor structure 300 along path P21, whereby such inter-layer electrical coupling may be provided by an electrically conductive via (not shown). At point S, the start portion of the inner-spiral track 314 electrically couples to intermediate-spiral track 312, within layer 1, along path P18.

Within layer 2, as indicated by the numbered arrows, the outer-spiral track 316 extends one half-turn along path P4 and returns back along the remaining half-turn denoted by path P5. For illustrative clarity, return path P5 is shown by a dotted arrow denoting only the last portion of the return path of the outer-spiral track 316 back to where outer-spiral track 316 started along path P4. The start of outer-spiral track 316 along path P4 is defined by S and the return of outer-spiral track 316 after approximately a full turn is defined by F. Thus, as depicted, the start point S of the outer-spiral track 316 is electrically isolated from the end point F of the outer-spiral track 316. At point F, the end portion of the outer-spiral track 316 electrically couples to outer-spiral track 322 within layer 3 of the inductor structure 300 along path P6, whereby such inter-layer electrical coupling (i.e., between layers 2 & 3) may be provided by an electrically conductive via (not shown). At point S, the start portion of the outer-spiral track 316 electrically couples to outer-spiral track 310 within layer 1 of the inductor structure 300 along path P3, whereby such inter-layer electrical coupling (i.e., between layers 1 & 2) may also be provided by an electrically conductive via (not shown).

Similarly, the intermediate-spiral track 318 of layer 2 extends one half-turn along path P13 and returns back along the remaining half-turn denoted by path P14. For illustrative clarity, return path P14 is shown by a dotted arrow denoting only the last portion of the return path of the intermediate-spiral track 318 back to where intermediate-spiral track 318 started along path P13. The start of intermediate-spiral track 318 along path P13 is defined by S and the return of intermediate-spiral track 318 after approximately a full turn is defined by F. Thus, as depicted, the start point S of the inter-mediate-spiral track 318 is electrically isolated from the end point F of the intermediate-spiral track 318. At point F, the end portion of the intermediate-spiral track 318 electrically couples to intermediate-spiral track 312 of layer 1 along path P15. Also, at point S, the start portion of the intermediate-spiral track 318 electrically couples to intermediate-spiral track 324 within layer 3 of the inductor structure 300 along path P12. The inter-layer electrical coupling between the intermediate-spiral track 318 of layer 2 and the intermediate-spiral tracks 312, 324 of layers 1 and 2 may be provided by electrically conductive vias (not shown).

Also within layer 2, the inner-spiral track 320 extends one half-turn along path P22 and returns back along the remaining half-turn denoted by path P23. For illustrative clarity, return path P23 is shown by a dotted arrow denoting only the last portion of the return path of the inner-spiral track 320 back to where inner-spiral track 320 started along path P22. The start of inner-spiral track 320 along path P22 is defined by S and the return of inner-spiral track 320 after approximately a full turn is defined by F. Thus, as depicted, the start point S of the inner-spiral track 320 is electrically isolated from the end point F of the inner-spiral track 320. At point F, the end portion of the inner-spiral track 320 electrically couples to inner-spiral track 326 within layer 3 of the inductor structure 300 along path P24, whereby such inter-layer electrical coupling may be provided by an electrically conductive via (not shown). At point S, the start portion of the inner-spiral track 320 electrically couples to inner-spiral track 314 of layer 1 along path P21, whereby such inter-layer electrical coupling may also be provided by an electrically conductive via (not shown).

Within layer 3, as indicated by the numbered arrows, the outer-spiral track 322 extends one half-turn along path P7 and returns back along the remaining half-turn denoted by path P8. For illustrative clarity, return path P8 is shown by a dotted arrow denoting only the last portion of the return path of the outer-spiral track 322 back to where outer-spiral track 322 started along path P7. The start of outer-spiral track 322 along path P7 is defined by S and the return of outer-spiral track 322 after approximately a full turn is defined by F. Thus, as depicted, the start point S of the outer-spiral track 322 is electrically isolated from the end point F of the outer-spiral track 322. At point F, the end portion of the outer-spiral track 322 electrically couples to intermediate-spiral track 324 within layer 3 of the inductor structure 300 along path P9. At point S, the start portion of the outer-spiral track 322 electrically couples to outer-spiral track 316 within layer 2 of the inductor structure 300 along path P6.

Similarly, the intermediate-spiral track 324 of layer 3 extends one half-turn along path P10 and returns back along the remaining half-turn denoted by path P11. For illustrative clarity, return path P11 is shown by a dotted arrow denoting only the last portion of the return path of the intermediate-spiral track 324 back to where intermediate-spiral track 324 started along path P10. The start of intermediate-spiral track 324 along path P10 is defined by S and the return of intermediate-spiral track 324 after approximately a full turn is defined by F. Thus, as depicted, the start point S of the inter-mediate-spiral track 324 is electrically isolated from the end point F of the intermediate-spiral track 324. At point F, the end portion of the intermediate-spiral track 324 electrically couples to intermediate-spiral track 318 of layer 2 along path P12, whereby such inter-layer electrical coupling may be provided by an electrically conductive via (not shown). At point S, the start portion of the intermediate-spiral track 324 electrically couples to outer-spiral track 322 within the same layer along path P9, whereby such inter-spiral electrical coupling may be provided by an electrical connection (not shown).

Also within layer 3, the inner-spiral track 326 extends one half-turn along path P25 and returns back along the remaining half-turn denoted by path P26. For illustrative clarity, return path P26 is shown by a dotted arrow denoting only the last portion of the return path of the inner-spiral track 326 back to where inner-spiral track 326 started along path P25. The start of inner-spiral track 326 along path P25 is defined by S and the return of inner-spiral track 326 after approximately a full turn is defined by F. Thus, as depicted, the start point S of the inner-spiral track 326 is electrically isolated from the end point F of the inner-spiral track 326. Point F of the inner-spiral track 326 may be designated as the inductor structure 300 output (Out). At point S, the start portion of the inner-spiral track 326 electrically couples to inner-spiral track 320 of layer 2 along path P24, whereby such inter-layer electrical coupling may be provided by an electrically conductive via (not shown).

As shown in FIG. 3, the turn radius of the outer-spiral 310 on layer 1 is larger than the turn radius of the outer-spiral 316 on layer 2. Also, the turn radius of the outer-spiral 316 on layer 2 is larger than the turn radius of the outer-spiral 322 on layer 3. Thus, the turn radiuses of the outer-spiral tracks 310, 316, 322 progressively reduce from layer 1 through to layer 3.

Conversely, the turn radius of the intermediate-spiral 324 on layer 3 is smaller than the turn radius of the intermediate-spiral 318 on layer 2. Also, the turn radius of the intermediate-spiral 318 on layer 2 is smaller than the turn radius of the intermediate-spiral 312 on layer 1. Thus, the turn radiuses of the intermediate-spiral tracks 324, 318, 312 progressively increase from layer 3 through to layer 1.

The turn radius of the inner-spiral 314 on layer 1 is, however, larger than the turn radius of the inner-spiral 320 on layer 2. Also, the turn radius of the inner-spiral 320 on layer 2 is larger than the turn radius of the inner-spiral 326 on layer 3. Thus, the turn radiuses of the inner-spiral tracks 314, 320, 326 progressively reduce from layer 1 through to layer 3.

The foregoing described relationship between the radiuses of the spiral tracks enable the electrical current to follow multiple conical paths, whereby as the current is input (In) to the inductor structure 300 at spiral track 310 (i.e., point S), the current path progressively propagates along spiral tracks of reducing radius when undergoing a first pass from layer 1 to layer 3. This is a first conical path of reducing radius. The current path then progressively propagates along spiral tracks of increasing radius when undergoing a second pass from layer 3 back to layer 1. This is a second conical path of increasing radius. The current path subsequently propagates along spiral tracks of decreasing radius when undergoing a third pass from layer 1 back up to layer 1, where the current reaches the output (Out) of the inductor structure 300 at spiral track 326 (i.e., point F). This is a third conical path of decreasing radius. As previously indicated in relation to FIG. 2, the electrical current propagates throughout layers 1, 2, and 3 multiple times, as does a folded inductor structure. Further, details of the electrical current flow within inductor structure 300 are provided in the following paragraphs. It may be appreciated that current flow along the spiral tracks within the embodiment of FIG. 3 follows a substantially similar sequence to that of FIG. 2.

Referring to FIG. 3, the electrical current flow follows the depicted sequence indicated by paths P1-P26. As illustrated, electrical current may be received by the inductor component 300 at point S (i.e., In) of outer-spiral track 310 within layer 1. The current flows, from point S, in a counter-clockwise direction along paths P1 and P2 back to point F of the outer-spiral track 310. Thus, the current flows approximately a full turn on the outer-spiral track 310. At point F of outer-spiral track 310, a via connection may electrically couple the outer-spiral track 310 of layer 1 to the outer-spiral track 316 of layer 2 along path P3.

From path P3, electrical current may be received at point S of outer-spiral track 316 within layer 2. The current flows, from point S, in a counter-clockwise direction along paths P4 and P5 back to point F of the outer-spiral track 316. Thus, the current flows approximately a full turn on the outer-spiral track 316. At point F of outer-spiral track 316, a via connection may electrically couple outer-spiral track 316 of layer 2 to outer-spiral track 322 of layer 3 along path P6.

From path P6, electrical current may be received at point S of outer-spiral track 322 within layer 3. The current flows, from point S, in a counter-clockwise direction along paths P7 and P8 back to point F of the outer-spiral track 322. Thus, the current flows approximately a full turn on the outer-spiral track 322. At point F of outer-spiral track 322, an electrical connection may couple outer-spiral track 322 of layer 3 to intermediate-spiral track 324 within the same layer (i.e., layer 3) along path P9. Accordingly, as described, current flows in the outer-spiral track of each layer before propagating within the next inner track (e.g., intermediate-spiral) of each layer.

From path P9, electrical current may be received at point S of intermediate-spiral track 324 within layer 3. The current flows, from point S, in a counter-clockwise direction along paths P10 and P11 back to point F of the intermediate-spiral track 324. Thus, the current flows approximately a full turn on the outer-spiral track 324. At point F of intermediate-spiral track 324, a via connection may electrically couple intermediate-spiral track 324 of layer 3 to intermediate-spiral track 318 of layer 2 along path P12.

From path P12, electrical current may be received at point S of intermediate-spiral track 318 within layer 2. The current flows, from point S, in a counter-clockwise direction along paths P13 and P14 back to point F of the intermediate-spiral track 318. Thus, the current flows approximately a full turn on the intermediate-spiral track 318. At point F of intermediate-spiral track 318, a via connection may electrically couple intermediate-spiral track 318 of layer 2 to intermediate-spiral track 312 of layer 1 along path P15.

From path P15, electrical current may be received at point S of intermediate-spiral track 312 within layer 1. The current flows, from point S, in a counter-clockwise direction along paths P16 and P17 back to point F of the intermediate-spiral track 312. Thus, the current flows approximately a full turn on the intermediate-spiral track 312. At point F of intermediate-spiral track 312, an electrical connection may couple intermediate-spiral track 312 of layer 1 to inner-spiral track 314 within the same layer (i.e., layer 1) along path P18. Accordingly, as described, current flows in the intermediate-spiral track of each layer before propagating within the next inner track (e.g., inner-spiral) of each layer.

From path P18, electrical current may be received at point S of inner-spiral track 314 within layer 1. The current flows, from point S, in a counter-clockwise direction along paths P19 and P20 back to point F of the inner-spiral track 314. Thus, the current flows approximately a full turn on the inner-spiral track 314. At point F of inner-spiral track 314, a via connection may electrically couple inner-spiral track 314 of layer 1 to inner-spiral track 320 of layer 2 along path P21.

From path P21, electrical current may be received at point S of inner-spiral track 320 within layer 2. The current flows, from point S, in a counter-clockwise direction along paths P22 and P23 back to point F of the inner-spiral track 320. Thus, the current flows approximately a full turn on the inner-spiral track 320. At point F of inner-spiral track 320, a via connection may electrically couple inner-spiral track 320 of layer 2 to inner-spiral track 326 of layer 3 along path P24.

From path P24, electrical current may be received at point S of inner-spiral track 326 within layer 3. The current flows, from point S, in a counter-clockwise direction along paths P25 and P26 back to point F of the inner-spiral track 326. Thus, the current flows approximately a full turn on the inner-spiral track 326. At point F of inner-spiral track 326, an electrical connection (i.e., labeled Out) may couple inner-spiral track 326 of layer 3 to other components on the chip. Accordingly, as described, current flows in the inner-spiral track of each layer before being output from the inductor structure 300.

Although each spiral track of each metal layer is about one single full turn, a spiral track with multiple turns may also be contemplated. For example, outer-spiral track 310 is about a full turn within metal layer 1. However, according to other embodiments, outer-spiral track 310 may undergo multiple turns (i.e., two or more) before electrically coupling to outer-spiral track 316 by means of path P3.

In contrast with a stacked inductor (e.g., see FIG. 1), the exemplary inductor structure 300 of FIG. 3 includes a folded structure, whereby the current propagates approximately a single full turn within each metal layer before transitioning to the next adjacent metal layer. In contrast, within a stacked inductor, the current propagates along the entire spiral path of a metal layer before transitioning to the next metal layer. The net effect of the folded structure is a reduction in capacitance caused by the metal-to-metal capacitance between the spiral tracks of each metal layer. As previously indicated in the foregoing, the equivalent circuit of a folded inductor structure may yield a metal-to-metal capacitance between the spiral tracks that are in series. Thus, the net value of the series capacitance yields a reduced capacitance value based on the series formation. The equivalent circuit of a stacked inductor structure may, however yield a metal-to-metal capacitance between the spiral tracks that are in parallel. Thus, the net value of the parallel capacitance yields an increased capacitance value based on the parallel formation.

Figure 4:
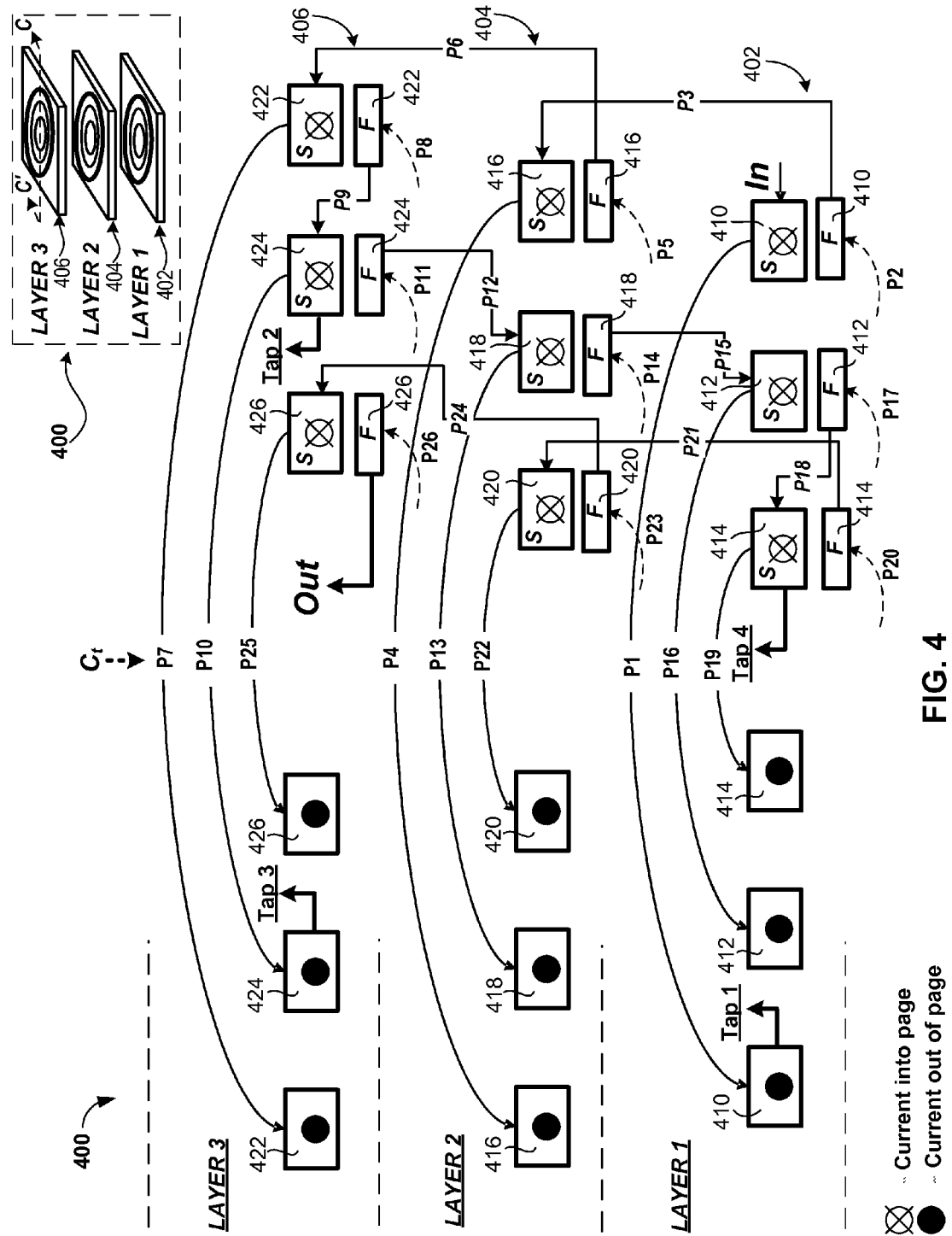
FIG. 4 is a cross-sectional view of an on-chip inductor structure according to yet another embodiment of the invention.

FIG. 4 illustrates a cross-sectional view along axis C-C' of a semiconductor on-chip inductor structure 400 according to an exemplary embodiment. As depicted, inductor structure 400 may be formed within three metal layers of a semiconductor device, although the use of more or less metal layers for the purpose of fabricating an on-chip inductor may also be contemplated.

Particularly, metal layer 1 includes spiral structure 402, metal layer 2 includes spiral structure 404, and metal layer 3 includes spiral structure 406. As illustrated by the cross-sectional view, spiral structure 402 within layer 1 may include outer-spiral track 410, intermediate-spiral track 412, and inner-spiral track 414, whereby each of the spiral tracks may be constructed from an electrically conductive material such as, for example, copper, tungsten, or aluminum. Also, spiral structure 404 within layer 2 may include outer-spiral track 416, intermediate-spiral track 418, and inner-spiral track 420, whereby each of these spiral tracks may be constructed from an electrically conductive material such as, for example, copper, tungsten, or aluminum. Spiral structure 406 within layer 3 may include outer-spiral track 422, intermediate-spiral track 424, and inner-spiral track 426, whereby each of these spiral tracks may also be constructed from an electrically conductive material such as, for example, copper, tungsten, or aluminum.

The above-described spiral tracks may be lithographically formed (i.e., photolithography and etching) on the metal layers of a semiconductor device, whereby upon the deposition of an interlayer dielectric (ILD) material over each metal layer, both laterally and vertically adjacent spiral tracks are insulted by the ILD material. However, vertically adjacent isolated spiral tracks may be electrically coupled using one or more via connections, while laterally adjacent isolated spiral tracks may be electrically coupled using electrical conductors (e.g., copper tracks). As described in the following paragraphs, the via connections and electrical conductors may be used to electrically couple the various spiral tracks of the inductor structure 400 that exist both within and on the different metal layers. The thickness of the spiral tracks may be limited to the metal layer thicknesses while the width of the spiral tracks may be designed to range from approximately 2-50 μm, preferably between about 1-10 μm. Metal layer 1 may be about 3 μm, metal layer 2 may be about 6 μm, and metal layer 3 may be approximately 4 μm, however, different layer thicknesses are contemplated depending on the choice of semiconductor technology.

Also, within each metal layer, as the spiral tracks reduce in radius towards the center of the spiral structure (depicted by $C_t$), their corresponding track width may be reduced (not shown). This reduction in width as the track radius approaches $C_t$ may be intended to optimally utilize the track cross-sectional area where the highest current density flows. The track current tends to flow on one side or the other of spiral tracks under the influence of high magnetic fields as seen near $C_t$ due to interaction with the magnetic fields of adjacent tracks both vertically and horizontally (commonly referred to as proximity effect). Removing track sections containing little current density reduces parasitic capacitance, increasing $f_{sr}$ and peak Q, while not increasing series resistance at high frequencies. For example, within layer 1, the track width of inner-spiral track 414 may be reduced relative to the track width of intermediate-spiral track 412 and the track width of intermediate-spiral track 412 may be reduced relative to the track width of outer-spiral track 410. The reduction of track width addresses an increase in proximity effect as the spiral tracks become closer (e.g., track 414) to the center of spiral structure $C_t$. Similarly, within layer 2, the track width of inner-spiral track 420 may be reduced relative to the track width of intermediate-spiral track 418, while the track width of intermediate-spiral track 418 may be reduced relative to the track width of outer-spiral track 416. The reduction of track width addresses an increase in proximity effect as the spiral tracks become closer (e.g., track 420) to the center of spiral structure $C_t$. Also, within layer 3, the track width of inner-spiral track 426 may be reduced relative to the track width of intermediate-spiral track 424, and the track width of intermediate-spiral track 424 may be reduced relative to the track width of outer-spiral track 422. The reduction of track width addresses an increase in proximity effect as the spiral tracks become closer (e.g., track 426) to the center of spiral structure $C_t$.

The following paragraphs describe the structural details and electrical connectivity between the spiral structures 402, 404, 406 of the inductor structure 400. Subsequently, an operational flow of current through inductor structure 400 will be described. It may also be noted that the following description of spiral structures 402, 404, and 406 refer to a start point (S) and end point (F) for each spiral track. The start point (S) may signify the position on the track where electrical current enters as either an inductor component input (e.g., see FIG. 4: spiral track 410, In) or enters as an electrical current output from another spiral track (e.g., see FIG. 4: spiral track 416, S). The end point (F) may signify a position on the track where electrical current exits as either an inductor component output (e.g., FIG. 4: spiral track 426, Out) or exits as an electrical current that may be input to another adjacent spiral track (e.g., see FIG. 4: spiral track 410, F). Also, from a structural perspective, the start point (S) may indicate where the spiral track physically starts while the end point (F) may accordingly indicate where the spiral track ends.

Within layer 1, as indicated by the numbered arrows, the outer-spiral track 410 extends one half-turn along path P1 and returns back along the remaining half-turn denoted by path P2. For illustrative clarity, return path P2 is shown by a dotted arrow denoting only the last portion of the return path of the outer-spiral track 410 back to where outer-spiral track 410 started along path P1. The start of outer-spiral track 410 along path P1 is defined by S and the return of outer-spiral track 410 after approximately a full turn is defined by F. Thus, as depicted, the start point S of the outer-spiral track 410 is electrically isolated from the end point F of the outer-spiral track 410. At point F, the end portion of the outer-spiral track 410 electrically couples to outer-spiral track 416 within layer 2 of the inductor structure 400 along path P3, whereby such inter-layer electrical coupling (i.e., between layers 1 & 2) may be provided by an electrically conductive via (not shown). Point S of the outer-spiral track 410 may be designated as the inductor structure 400 input (In).

Similarly, the intermediate-spiral track 412 of layer 1 extends one half-turn along path P16 and returns back along the remaining half-turn denoted by path P17. For illustrative clarity, return path P17 is shown by a dotted arrow denoting only the last portion of the return path of the intermediate-spiral track 412 back to where intermediate-spiral track 412 started along path P16. The start of intermediate-spiral track 412 along path P16 is defined by S and the return of intermediate-spiral track 412 after approximately a full turn is defined by F. Thus, as depicted, the start point S of the intermediate-spiral track 412 is electrically isolated from the end point F of the intermediate-spiral track 412. At point F, the end portion of the intermediate-spiral track 412 electrically couples to inner-spiral track 414, within layer 1, along path P18. Also, at point S, the start portion of the intermediate-spiral track 412 electrically couples to intermediate-spiral track 418 within layer 2 of the inductor structure 400 along path P15, whereby such inter-layer electrical coupling may be provided by an electrically conductive via (not shown).

Also within layer 1, the inner-spiral track 414 extends one half-turn along path P19 and returns back along the remaining half-turn denoted by path P20. For illustrative clarity, return path P20 is shown by a dotted arrow denoting only the last portion of the return path of the inner-spiral track 414 back to where inner-spiral track 414 started along path P19. The start of inner-spiral track 414 along path P19 is defined by S and the return of inner-spiral track 414 after approximately a full turn is defined by F. Thus, as depicted, the start point S of the inner-spiral track 414 is electrically isolated from the end point F of the inner-spiral track 414. At point F, the end portion of the inner-spiral track 414 electrically couples to inner-spiral track 420 within layer 2 of the inductor structure 400 along path P21, whereby such inter-layer electrical coupling may be provided by an electrically conductive via (not shown). At point S, the start portion of the inner-spiral track 414 electrically couples to intermediate-spiral track 412, within layer 1, along path P18.

Within layer 2, as indicated by the numbered arrows, the outer-spiral track 416 extends one half-turn along path P4 and returns back along the remaining half-turn denoted by path P5. For illustrative clarity, return path P5 is shown by a dotted arrow denoting only the last portion of the return path of the outer-spiral track 416 back to where outer-spiral track 416 started along path P4. The start of outer-spiral track 416 along path P4 is defined by S and the return of outer-spiral track 416 after approximately a full turn is defined by F. Thus, as depicted, the start point S of the outer-spiral track 416 is electrically isolated from the end point F of the outer-spiral track 416. At point F, the end portion of the outer-spiral track 416 electrically couples to outer-spiral track 422 within layer 3 of the inductor structure 400 along path P6, whereby such inter-layer electrical coupling (i.e., between layers 2 & 3) may be provided by an electrically conductive via (not shown). At point S, the start portion of the outer-spiral track 416 electrically couples to outer-spiral track 410 within layer 1 of the inductor structure 400 along path P3, whereby such inter-layer electrical coupling (i.e., between layers 1 & 2) may also be provided by an electrically conductive via (not shown).

Similarly, the intermediate-spiral track 418 of layer 2 extends one half-turn along path P13 and returns back along the remaining half-turn denoted by path P14. For illustrative clarity, return path P14 is shown by a dotted arrow denoting only the last portion of the return path of the intermediate-spiral track 418 back to where intermediate-spiral track 418 started along path P13. The start of intermediate-spiral track 418 along path P13 is defined by S and the return of intermediate-spiral track 418 after approximately a full turn is defined by F. Thus, as depicted, the start point S of the intermediate-spiral track 418 is electrically isolated from the end point F of the intermediate-spiral track 418. At point F, the end portion of the intermediate-spiral track 418 electrically couples to intermediate-spiral track 412 of layer 1 along path P15. Also, at point S, the start portion of the intermediate-spiral track 418 electrically couples to intermediate-spiral track 424 within layer 3 of the inductor structure 400 along path P12. The inter-layer electrical coupling between the intermediate-spiral track 418 of layer 2 and the intermediate-spiral tracks 412, 424 of layers 1 and 2 may be provided by electrically conductive vias (not shown).

Also within layer 2, the inner-spiral track 420 extends one half-turn along path P22 and returns back along the remaining half-turn denoted by path P23. For illustrative clarity, return path P23 is shown by a dotted arrow denoting only the last portion of the return path of the inner-spiral track 420 back to where inner-spiral track 420 started along path P22. The start of inner-spiral track 420 along path P22 is defined by S and the return of inner-spiral track 420 after approximately a full turn is defined by F. Thus, as depicted, the start point S of the inner-spiral track 420 is electrically isolated from the end point F of the inner-spiral track 420. At point F, the end portion of the inner-spiral track 420 electrically couples to inner-spiral track 426 within layer 3 of the inductor structure 400 along path P24, whereby such inter-layer electrical coupling may be provided by an electrically conductive via (not shown). At point S, the start portion of the inner-spiral track 420 electrically couples to inner-spiral track 414 of layer 1 along path P21, whereby such inter-layer electrical coupling may also be provided by an electrically conductive via (not shown).

Within layer 3, as indicated by the numbered arrows, the outer-spiral track 422 extends one half-turn along path P7 and returns back along the remaining half-turn denoted by path P8. For illustrative clarity, return path P8 is shown by a dotted arrow denoting only the last portion of the return path of the outer-spiral track 422 back to where outer-spiral track 422 started along path P7. The start of outer-spiral track 422 along path P7 is defined by S and the return of outer-spiral track 422 after approximately a full turn is defined by F. Thus, as depicted, the start point S of the outer-spiral track 422 is electrically isolated from the end point F of the outer-spiral track 422. At point F, the end portion of the outer-spiral track 422 electrically couples to intermediate-spiral track 424 within layer 3 of the inductor structure 400 along path P9. At point S, the start portion of the outer-spiral track 422 electrically couples to outer-spiral track 416 within layer 2 of the inductor structure 400 along path P6.

Similarly, the intermediate-spiral track 424 of layer 3 extends one half-turn along path P10 and returns back along the remaining half-turn denoted by path P11. For illustrative clarity, return path P11 is shown by a dotted arrow denoting only the last portion of the return path of the intermediate-spiral track 424 back to where intermediate-spiral track 424 started along path P10. The start of intermediate-spiral track 424 along path P10 is defined by S and the return of intermediate-spiral track 424 after approximately a full turn is defined by F. Thus, as depicted, the start point S of the intermediate-spiral track 424 is electrically isolated from the end point F of the intermediate-spiral track 424. At point F, the end portion of the intermediate-spiral track 424 electrically couples to intermediate-spiral track 418 of layer 2 along path P12, whereby such inter-layer electrical coupling may be provided by an electrically conductive via (not shown). At point S, the start portion of the intermediate-spiral track 424 electrically couples to outer-spiral track 422 within the same layer along path P9, whereby such inter-spiral electrical coupling may be provided by an electrical connection (not shown).

Also within layer 3, the inner-spiral track 426 extends one half-turn along path P25 and returns back along the remaining half-turn denoted by path P26. For illustrative clarity, return path P26 is shown by a dotted arrow denoting only the last portion of the return path of the inner-spiral track 426 back to where inner-spiral track 426 started along path P25. The start of inner-spiral track 426 along path P25 is defined by S and the return of inner-spiral track 426 after approximately a full turn is defined by F. Thus, as depicted, the start point S of the inner-spiral track 426 is electrically isolated from the end point F of the inner-spiral track 426. Point F of the inner-spiral track 426 may be designated as the inductor structure 400 output (Out). At point S, the start portion of the inner-spiral track 426 electrically couples to inner-spiral track 420 of layer 2 along path P24, whereby such inter-layer electrical coupling may be provided by an electrically conductive via (not shown).

As shown in FIG. 4, the turn radius of the outer-spiral 410 on layer 1 is smaller than the turn radius of the outer-spiral 416 on layer 2. Also, the turn radius of the outer-spiral 416 on layer 2 is smaller than the turn radius of the outer-spiral 422 on layer 3. Thus, the turn radiuses of the outer-spiral tracks 410, 416, 422 progressively increase from layer 1 through to layer 3.

Conversely, the turn radius of the intermediate-spiral 424 on layer 3 is greater than the turn radius of the intermediate-spiral 418 on layer 2. Also, the turn radius of the intermediate-spiral 418 on layer 2 is greater than the turn radius of the intermediate-spiral 412 on layer 1. Thus, the turn radiuses of the intermediate-spiral tracks 424, 418, 412 progressively decrease from layer 3 through to layer 1.

The turn radius of the inner-spiral 414 on layer 1 is, however, smaller than the turn radius of the inner-spiral 420 on layer 2. Also, the turn radius of the inner-spiral 420 on layer 2 is smaller than the turn radius of the inner-spiral 426 on layer 3. Thus, the turn radiuses of the inner-spiral tracks 414, 420, 426 progressively increase from layer 1 through to layer 3.

The foregoing described relationship between the radiuses of the spiral tracks enable the electrical current to follow multiple conical paths, whereby as the current is input (In) to the inductor structure 400 at spiral track 410 (i.e., point S), the current path progressively propagates along spiral tracks of increasing radius when undergoing a first pass from layer 1 to layer 3. This is a first conical path of increasing radius. The current path then progressively propagates along spiral tracks of decreasing radius when undergoing a second pass from layer 3 back to layer 1. This is a second conical path of decreasing radius. The current path subsequently propagates along spiral tracks of increasing radius when undergoing a third pass from layer 1 back up to layer 3, where the current reaches the output (Out) of the inductor structure 400 at spiral track 426 (i.e., point F). This is a third conical path of increasing radius. As previously indicated in relation to FIGS. 2 & 3, the electrical current propagates throughout layers 1, 2, and 3 multiple times, as does a folded inductor structure. Further, details of the electrical current flow within inductor structure 400 are provided in the following paragraphs. It may be appreciated that current flow along the spiral tracks within the embodiment of FIG. 4 follows a substantially similar sequence to that of FIGS. 2 & 3.

Referring to FIG. 4, the electrical current flow follows the depicted sequence indicated by paths P1-P26. As illustrated, electrical current may be received by the inductor component 400 at point S (i.e., In) of outer-spiral track 410 within layer 1. The current flows, from point S, in a counter-clockwise direction along paths P1 and P2 back to point F of the outer-spiral track 410. Thus, the current flows approximately a full turn on the outer-spiral track 410. At point F of outer-spiral track 410, a via connection may electrically couple the outer-spiral track 410 of layer 1 to the outer-spiral track 416 of layer 2 along path P3.

From path P3, electrical current may be received at point S of outer-spiral track 416 within layer 2. The current flows, from point S, in a counter-clockwise direction along paths P4 and P5 back to point F of the outer-spiral track 416. Thus, the current flows approximately a full turn on the outer-spiral track 416. At point F of outer-spiral track 416, a via connection may electrically couple outer-spiral track 416 of layer 2 to outer-spiral track 422 of layer 3 along path P6.

From path P6, electrical current may be received at point S of outer-spiral track 422 within layer 3. The current flows, from point S, in a counter-clockwise direction along paths P7 and P8 back to point F of the outer-spiral track 422. Thus, the current flows approximately a full turn on the outer-spiral track 422. At point F of outer-spiral track 422, an electrical connection may couple outer-spiral track 422 of layer 3 to intermediate-spiral track 424 within the same layer (i.e., layer 3) along path P9. Accordingly, as described, current flows in the outer-spiral track of each layer before propagating within the next inner track (e.g., intermediate-spiral) of each layer.

From path P9, electrical current may be received at point S of intermediate-spiral track 424 within layer 3. The current flows, from point S, in a counter-clockwise direction along paths P10 and P11 back to point F of the intermediate-spiral track 424. Thus, the current flows approximately a full turn on the outer-spiral track 424. At point F of intermediate-spiral track 424, a via connection may electrically couple intermediate-spiral track 424 of layer 3 to intermediate-spiral track 418 of layer 2 along path P12.

From path P12, electrical current may be received at point S of intermediate-spiral track 418 within layer 2. The current flows, from point S, in a counter-clockwise direction along paths P13 and P14 back to point F of the intermediate-spiral track 418. Thus, the current flows approximately a full turn on the intermediate-spiral track 418. At point F of intermediate-spiral track 418, a via connection may electrically couple intermediate-spiral track 418 of layer 2 to intermediate-spiral track 412 of layer 1 along path P15.

From path P15, electrical current may be received at point S of intermediate-spiral track 412 within layer 1. The current flows, from point S, in a counter-clockwise direction along paths P16 and P17 back to point F of the intermediate-spiral track 412. Thus, the current flows approximately a full turn on the intermediate-spiral track 412. At point F of intermediate-spiral track 412, an electrical connection may couple intermediate-spiral track 412 of layer 1 to inner-spiral track 414 within the same layer (i.e., layer 1) along path P18. Accordingly, as described, current flows in the intermediate-spiral track of each layer before propagating within the next inner track (e.g., inner-spiral) of each layer.

From path P18, electrical current may be received at point S of inner-spiral track 414 within layer 1. The current flows, from point S, in a counter-clockwise direction along paths P19 and P20 back to point F of the inner-spiral track 414. Thus, the current flows approximately a full turn on the inner-spiral track 414. At point F of inner-spiral track 414, a via connection may electrically couple inner-spiral track 414 of layer 1 to inner-spiral track 420 of layer 2 along path P21.

From path P21, electrical current may be received at point S of inner-spiral track 420 within layer 2. The current flows, from point S, in a counter-clockwise direction along paths P22 and P23 back to point F of the inner-spiral track 420. Thus, the current flows approximately a full turn on the inner-spiral track 420. At point F of inner-spiral track 420, a via connection may electrically couple inner-spiral track 420 of layer 2 to inner-spiral track 426 of layer 3 along path P24.

From path P24, electrical current may be received at point S of inner-spiral track 426 within layer 3. The current flows, from point S, in a counter-clockwise direction along paths P25 and P26 back to point F of the inner-spiral track 426. Thus, the current flows approximately a full turn on the inner-spiral track 426. At point F of inner-spiral track 426, an electrical connection (i.e., labeled Out) may couple inner-spiral track 426 of layer 3 to other components on the chip. Accordingly, as described, current flows in the inner-spiral track of each layer before being output from the inductor structure 400.

Although each spiral track of each metal layer is about one single full turn, a spiral track with multiple turns may also be contemplated. For example, outer-spiral track 410 is about a full turn within metal layer 1. However, according to other embodiments, outer-spiral track 410 may undergo multiple turns (i.e., two or more) before electrically coupling to outer-spiral track 416 by means of path P3.

In contrast with a stacked inductor (e.g., see FIG. 1), the exemplary inductor structure 400 of FIG. 4 includes a folded structure, whereby the current propagates approximately a single full turn within each metal layer before transitioning to the next adjacent metal layer. In contrast, within a stacked inductor, the current propagates along the entire spiral path of a metal layer before transitioning to the next metal layer. The net effect of the folded structure is a reduction in capacitance caused by the metal-to-metal capacitance between the spiral tracks of each metal layer. As previously indicated in the foregoing, the equivalent circuit of a folded inductor structure may yield a metal-to-metal capacitance between the spiral tracks that are in series. Thus, the net value of the series capacitance yields a reduced capacitance value based on the series formation. The equivalent circuit of a stacked inductor structure may, however yield a metal-to-metal capacitance between the spiral tracks that are in parallel. Thus, the net value of the parallel capacitance yields an increased capacitance value based on the parallel formation.

Referring back to the embodiment of FIG. 2, a folded conical inductor such as inductor structure 200 may include at least one port or tap (i.e., multiport structure) between the input (In) and Output (Out) in order to provide varied inductance values. For example, as illustrated in FIG. 2, inductor structure 200 may include multiple taps or ports, as defined by Tap 1, Tap 2, Tap 3, and Tap 4. By using the Taps (or ports) as alternative outputs, predetermined inductance values may be selectively used instead of the total inductance value existing between the input (In) and output (Out) of the inductor structure 200. For example, on inductor structure 200, a first desired inductance value may be provided between the input (In) at point S of track 210 and Tap 1 on track 210. In this example, the first desired inductance may include the smallest predetermined value. Also, on inductor structure 200, a second desired inductance value may be provided between the input (In) at point S of track 210 (layer 1) and Tap 2 of track 224 (layer 3). In this example, the second desired inductance may include a greater predetermined value in comparison to first desired inductance value. A third desired inductance value may also be provided between the input (In) at point S of track 210 (layer 1) and Tap 3 of track 224 (layer 3). In this example, the third desired inductance may include a greater predetermined value in comparison to both the first and second desired inductance values. A fourth desired inductance value may be provided between the input (In) at point S of track 210 (layer 1) and Tap 4 of track 214 (layer 1). In this example, the fourth desired inductance may include a greater predetermined value in comparison to first, second, and third desired inductance values. In all cases, the first, second, third, and fourth inductance values are less than the total inductance value between the input (In) and Output (Out) of inductor structure 200. Further, other additional inductance values may be achieved between the taps or ports. For example, predetermined inductance values may be selected between Tap 1 and any one of Tap 2, Tap 3, Tap 4, or the output (Out); between Tap 2 and any one of Tap 3, Tap 4, or the output (Out); between Tap 3 and any one of Tap 4 or the output (Out).

The multiple tap or port structure of FIG. 2 applies in the same or similar manner to the embodiments of FIGS. 3-6. For example, referring to FIG. 3, predetermined inductance values may be selectively used instead of the total inductance value existing between the input (In) and output (Out) of the inductor structure 300. For example, on inductor structure 300, a first desired inductance value may be provided between the input (In) at point S of track 310 and Tap 1 on track 310. In this example, the first desired inductance may include the smallest predetermined value. Also, on inductor structure 300, a second desired inductance value may be provided between the input (In) at point S of track 310 (layer 1) and Tap 2 of track 324 (layer 3). In this example, the second desired inductance may include a greater predetermined value in comparison to first desired inductance value. A third desired inductance value may also be provided between the input (In) at point S of track 310 (layer 1) and Tap 3 of track 324 (layer 3). In this example, the third desired inductance may include a greater predetermined value in comparison to both the first and second desired inductance values. A fourth desired inductance value may be provided between the input (In) at point S of track 310 (layer 1) and Tap 4 of track 314 (layer 1). In this example, the fourth desired inductance may include a greater predetermined value in comparison to first, second, and third desired inductance values. In all cases, the first, second, third, and fourth inductance values are less than the total inductance value between the input (In) and Output (Out) of inductor structure 300. Further, other additional inductance values may be achieved between the taps or ports. For example, predetermined inductance values may be selected between Tap 1 and any one of Tap 2, Tap 3, Tap 4, or the output (Out); between Tap 2 and any one of Tap 3, Tap 4, or the output (Out); between Tap 3 and any one of Tap 4 or the output (Out).

Similarly, as depicted in FIG. 4, for example, predetermined inductance values may be selectively used instead of the total inductance value existing between the input (In) and output (Out) of the inductor structure 400. For example, on inductor structure 400, a first desired inductance value may be provided between the input (In) at point S of track 410 and Tap 1 on track 410. In this example, the first desired inductance may include the smallest predetermined value. Also, on inductor structure 400, a second desired inductance value may be provided between the input (In) at point S of track 410 (layer 1) and Tap 2 of track 424 (layer 3). In this example, the second desired inductance may include a greater predetermined value in comparison to first desired inductance value. A third desired inductance value may also be provided between the input (In) at point S of track 410 (layer 1) and Tap 3 of track 424 (layer 3). In this example, the third desired inductance may include a greater predetermined value in comparison to both the first and second desired inductance values. A fourth desired inductance value may be provided between the input (In) at point S of track 410 (layer 1) and Tap 4 of track 414 (layer 1). In this example, the fourth desired inductance may include a greater predetermined value in comparison to first, second, and third desired inductance values. In all cases, the first, second, third, and fourth inductance values are less than the total inductance value between the input (In) and Output (Out) of inductor structure 400. Further, other additional inductance values may be achieved between the taps or ports. For example, predetermined inductance values may be selected between Tap 1 and any one of Tap 2, Tap 3, Tap 4, or the output (Out); between Tap 2 and any one of Tap 3, Tap 4, or the output (Out); between Tap 3 and any one of Tap 4 or the output (Out).

Figure 5:
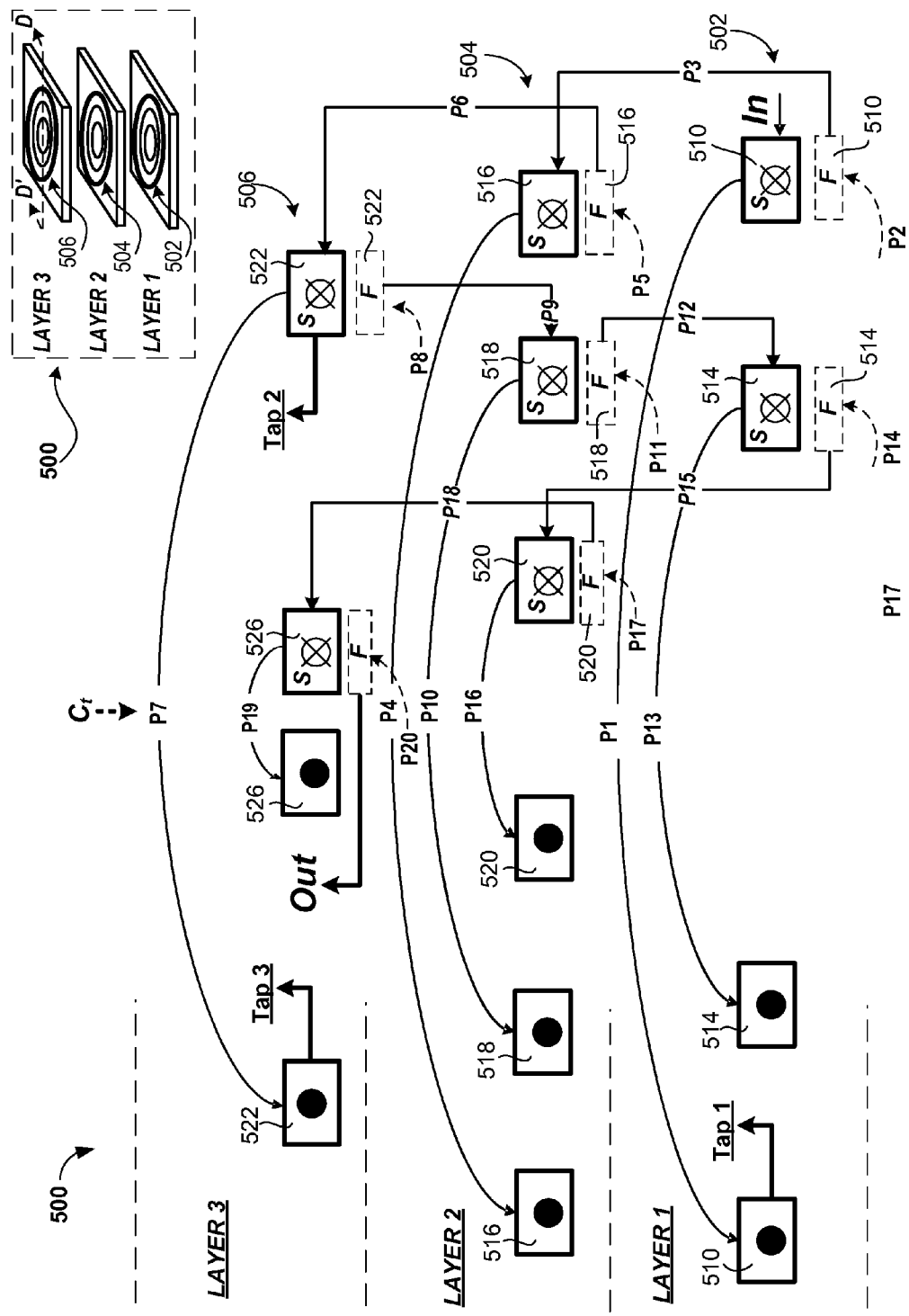
FIG. 5 is a cross-sectional view of an on-chip inductor structure according to yet another embodiment of the invention.

FIG. 5 illustrates a cross-sectional view along axis D-D' of a semiconductor on-chip inductor structure 500 according to an exemplary embodiment. As depicted, inductor structure 500 may also be formed within three metal layers of a semiconductor device, although the use of more or less metal layers for the purpose of fabricating an on-chip inductor may also be contemplated.

Particularly, metal layer 1 includes spiral structure 502, metal layer 2 includes spiral structure 504, and metal layer 3 includes spiral structure 506. As illustrated by the cross-sectional view, spiral structure 502 within layer 1 may include outer-spiral track 510 and inner-spiral track 514, whereby each of the spiral tracks may be constructed from an electrically conductive material such as, for example, copper, tungsten, or aluminum. Also, spiral structure 504 within layer 2 may include outer-spiral track 516, intermediate-spiral track 518, and inner-spiral track 520, whereby each of these spiral tracks may be constructed from an electrically conductive material such as, for example, copper, tungsten, or aluminum. Spiral structure 506 within layer 3 may include outer-spiral track 522 and inner-spiral track 526, whereby each of these spiral tracks may also be constructed from an electrically conductive material such as, for example, copper, tungsten, or aluminum.

The above-described spiral tracks may be lithographically formed (i.e., photolithography and etching) on the metal layers of a semiconductor device, whereby upon the deposition of an interlayer dielectric (ILD) material over each metal layer, both laterally and vertically adjacent spiral tracks are insulted by the ILD material. However, vertically adjacent isolated spiral tracks may be electrically coupled using one or more via connections, while laterally adjacent isolated spiral tracks may be electrically coupled using electrical conductors (e.g., copper tracks). As described in the following paragraphs, the via connections and electrical conductors may be used to electrically couple the various spiral tracks of the inductor structure 500 that exist both within and on the different metal layers. The thickness of the spiral tracks may be limited to the metal layer thicknesses while the width of the spiral tracks may be designed to range from approximately 1-50 μm, preferably between about 1-10 μm. Metal layer 1 may be about 3 μm, metal layer 2 may be about 6 μm, and metal layer 3 may be approximately 4 μm, however, different layer thicknesses are contemplated depending on the choice of semiconductor technology.

Also, within each metal layer, as the spiral tracks reduce in radius towards the center of the spiral structure (depicted by $C_t$), their corresponding track width may be reduced (not shown). This reduction in width as the track radius approaches $C_t$ may be intended to optimally utilize the track cross-sectional area where the highest current density flows. The track current tends to flow on one side or the other of spiral tracks under the influence of high magnetic fields as seen near $C_t$ due to interaction with the magnetic fields of adjacent tracks both vertically and horizontally (commonly referred to as proximity effect). Removing track sections containing little current density reduces parasitic capacitance, increasing $f_{sr}$ and peak Q, while not increasing series resistance at high frequencies. For example, within layer 1, the track width of inner-spiral track 514 may be reduced relative to the track width of outer-spiral track 510. The reduction of track width addresses an increase in proximity effect as the spiral tracks become closer (e.g., track 514) to the center of spiral structure $C_t$. Similarly, within layer 2, the track width of inner-spiral track 520 may be reduced relative to the track width of intermediate-spiral track 218, while the track width of intermediate-spiral track 518 may be reduced relative to the track width of outer-spiral track 516. The reduction of track width addresses an increase in proximity effect as the spiral tracks become closer (e.g., track 520) to the center of spiral structure $C_t$. Also, within layer 3, the track width of inner-spiral track 526 may be reduced relative to the track width of outer-spiral track 522. The reduction of track width addresses an increase in proximity effect as the spiral tracks become closer (e.g., track 526) to the center of spiral structure $C_t$.

The following paragraphs describe the structural details and electrical connectivity between the spiral structures 502, 504, 506 of the inductor structure 500. Subsequently, an operational flow of current through inductor structure 500 will be described. It may also be noted that the following description of spiral structures 502, 504, and 506 refer to a start point (S) and end point (F) for each spiral track. The start point (S) may signify the position on the track where electrical current enters as either an inductor component input (e.g., see FIG. 5: spiral track 510, In) or enters as an electrical current output from another spiral track (e.g., see FIG. 5: spiral track 516, S). The end point (F) may signify a position on the track where electrical current exits as either an inductor component output (e.g., FIG. 5: spiral track 526, Out) or exits as an electrical current that may be input to another adjacent spiral track (e.g., see FIG. 5: spiral track 510, F). Also, from a structural perspective, the start point (S) may indicate where the spiral track physically starts while the end point (F) may accordingly indicate where the spiral track ends.

Within layer 1, as indicated by the numbered arrows, the outer-spiral track 510 extends one half-turn along path P1 and returns back along the remaining half-turn denoted by path P2. For illustrative clarity, return path P2 is shown by a dotted arrow denoting only the last portion of the return path of the outer-spiral track 510 back to where outer-spiral track 510 started along path P1. The start of outer-spiral track 510 along path P1 is defined by S and the return of outer-spiral track 510 after approximately a full turn is defined by F. Thus, as depicted, the start point S of the outer-spiral track 510 is electrically isolated from the end point F of the outer-spiral track 510. At point F, the end portion of the outer-spiral track 510 electrically couples to outer-spiral track 516 within layer 2 of the inductor structure 500 along path P3, whereby such inter-layer electrical coupling (i.e., between layers 1 & 2) may be provided by an electrically conductive via (not shown). Point S of the outer-spiral track 510 may be designated as the inductor structure 500 input (In).

Also within layer 1, the inner-spiral track 514 extends one half-turn along path P13 and returns back along the remaining half-turn denoted by path P14. For illustrative clarity, return path P14 is shown by a dotted arrow denoting only the last portion of the return path of the inner-spiral track 514 back to where inner-spiral track 514 started along path P13. The start of inner-spiral track 514 along path P13 is defined by S and the return of inner-spiral track 514 after approximately a full turn is defined by F. Thus, as depicted, the start point S of the inner-spiral track 514 is electrically isolated from the end point F of the inner-spiral track 514. At point F, the end portion of the inner-spiral track 514 electrically couples to inner-spiral track 520 within layer 2 of the inductor structure 500 along path P15, whereby such inter-layer electrical coupling may be provided by an electrically conductive via (not shown). At point S, the start portion of the inner-spiral track 514 electrically couples to intermediate-spiral track 518, within layer 2, along path P12.

Within layer 2, as indicated by the numbered arrows, the outer-spiral track 516 extends one half-turn along path P4 and returns back along the remaining half-turn denoted by path P5. For illustrative clarity, return path P5 is shown by a dotted arrow denoting only the last portion of the return path of the outer-spiral track 516 back to where outer-spiral track 516 started along path P4. The start of outer-spiral track 516 along path P4 is defined by S and the return of outer-spiral track 516 after approximately a full turn is defined by F. Thus, as depicted, the start point S of the outer-spiral track 516 is electrically isolated from the end point F of the outer-spiral track 516. At point F, the end portion of the outer-spiral track 516 electrically couples to outer-spiral track 522 within layer 3 of the inductor structure 500 along path P6, whereby such inter-layer electrical coupling (i.e., between layers 2 & 3) may be provided by an electrically conductive via (not shown). At point S, the start portion of the outer-spiral track 516 electrically couples to outer-spiral track 510 within layer 1 of the inductor structure 500 along path P3, whereby such inter-layer electrical coupling (i.e., between layers 1 & 2) may also be provided by an electrically conductive via (not shown).

Similarly, the intermediate-spiral track 518 of layer 2 extends one half-turn along path P10 and returns back along the remaining half-turn denoted by path P11. For illustrative clarity, return path P11 is shown by a dotted arrow denoting only the last portion of the return path of the intermediate-spiral track 518 back to where intermediate-spiral track 518 started along path P10. The start of intermediate-spiral track 518 along path P10 is defined by S and the return of intermediate-spiral track 518 after approximately a full turn is defined by F. Thus, as depicted, the start point S of the intermediate-spiral track 518 is electrically isolated from the end point F of the intermediate-spiral track 518. At point F, the end portion of the intermediate-spiral track 518 electrically couples to inner-spiral track 514 of layer 1 along path P12. Also, at point S, the start portion of the intermediate-spiral track 518 electrically couples to outer-spiral track 522 within layer 3 of the inductor structure 500 along path P9. The inter-layer electrical coupling between the intermediate-spiral track 518 of layer 2, and inner-spiral track 514 of layer 1 and outer-spiral track 522 of layer 3 may be provided by electrically conductive vias (not shown).

Also within layer 2, the inner-spiral track 520 extends one half-turn along path P16 and returns back along the remaining half-turn denoted by path P17. For illustrative clarity, return path P17 is shown by a dotted arrow denoting only the last portion of the return path of the inner-spiral track 520 back to where inner-spiral track 520 started along path P16. The start of inner-spiral track 520 along path P16 is defined by S and the return of inner-spiral track 520 after approximately a full turn is defined by F. Thus, as depicted, the start point S of the inner-spiral track 520 is electrically isolated from the end point F of the inner-spiral track 520. At point F, the end portion of the inner-spiral track 520 electrically couples to inner-spiral track 526 within layer 3 of the inductor structure 200 along path P18, whereby such inter-layer electrical coupling may be provided by an electrically conductive via (not shown). At point S, the start portion of the inner-spiral track 520 electrically couples to inner-spiral track 514 of layer 1 along path P15, whereby such inter-layer electrical coupling may also be provided by an electrically conductive via (not shown).

Within layer 3, as indicated by the numbered arrows, the outer-spiral track 522 extends one half-turn along path P7 and returns back along the remaining half-turn denoted by path P8. For illustrative clarity, return path P8 is shown by a dotted arrow denoting only the last portion of the return path of the outer-spiral track 522 back to where outer-spiral track 522 started along path P7. The start of outer-spiral track 522 along path P7 is defined by S and the return of outer-spiral track 522 after approximately a full turn is defined by F. Thus, as depicted, the start point S of the outer-spiral track 522 is electrically isolated from the end point F of the outer-spiral track 522. At point F, the end portion of the outer-spiral track 522 electrically couples to intermediate-spiral track 518 within layer 2 of the inductor structure 500 along path P9. At point S, the start portion of the outer-spiral track 522 electrically couples to outer-spiral track 516 within layer 2 of the inductor structure 500 along path P6.

Also within layer 3, the inner-spiral track 526 extends one half-turn along path P19 and returns back along the remaining half-turn denoted by path P20. For illustrative clarity, return path P20 is shown by a dotted arrow denoting only the last portion of the return path of the inner-spiral track 526 back to where inner-spiral track 526 started along path P19. The start of inner-spiral track 526 along path P19 is defined by S and the return of inner-spiral track 526 after approximately a full turn is defined by F. Thus, as depicted, the start point S of the inner-spiral track 526 is electrically isolated from the end point F of the inner-spiral track 526. Point F of the inner-spiral track 526 may be designated as the inductor structure 500 output (Out). At point S, the start portion of the inner-spiral track 526 electrically couples to inner-spiral track 520 of layer 2 along path P18, whereby such inter-layer electrical coupling may be provided by an electrically conductive via (not shown).

As shown in FIG. 5, the turn radius of the outer-spiral 510 on layer 1 is larger than the turn radius of the outer-spiral 516 on layer 2. Also, the turn radius of the outer-spiral 516 on layer 2 is larger than the turn radius of the outer-spiral 522 on layer 3. Thus, the turn radiuses of the outer-spiral tracks 510, 516, 522 progressively reduce from layer 1 through to layer 3.

Also, the turn radius of the intermediate-spiral 518 on layer 2 is larger than the turn radius of the inner-spiral 514 on layer 1. Also, the turn radius of the inner-spiral 514 on layer 1 is larger than the turn radius of the inner-spiral 520 on layer 2. Also, the turn radius of the inner-spiral 520 on layer 2 is larger than the turn radius of the inner-spiral 526 on layer 3. Thus, the turn radiuses of the intermediate-spiral track 518 and the inner-spiral tracks 514, 520, 526 progressively reduce from layer 2 through layer 1 and on through to layer 3.

The foregoing described relationship between the radiuses of the spiral tracks enable the electrical current to follow a substantially conical path, whereby as the current is input (In) to the inductor structure 500 at spiral track 510 (i.e., point S), the current path progressively propagates along spiral tracks of reducing radius until the current reaches the output (Out) of the inductor structure 500 at spiral track 526 (i.e., point F). Further, the electrical current propagates throughout layers 1, 2, and 3 multiple times, as does a folded inductor structure. Further, details of the electrical current flow within inductor structure 500 are provided in the following paragraphs.

Referring to FIG. 5, the electrical current flow follows the depicted sequence indicated by paths P1-P20. As illustrated, electrical current may be received by the inductor component 500 at point S (i.e., In) of outer-spiral track 510 within layer 1. The current flows, from point S, in a counter-clockwise direction along paths P1 and P2 back to point F of the outer-spiral track 510. Thus, the current flows approximately a full turn on the outer-spiral track 510. At point F of outer-spiral track 510, a via connection may electrically couple the outer-spiral track 510 of layer 1 to the outer-spiral track 516 of layer 2 along path P3.

From path P3, electrical current may be received at point S of outer-spiral track 516 within layer 2. The current flows, from point S, in a counter-clockwise direction along paths P4 and P5 back to point F of the outer-spiral track 516. Thus, the current flows approximately a full turn on the outer-spiral track 516. At point F of outer-spiral track 516, a via connection may electrically couple outer-spiral track 516 of layer 2 to outer-spiral track 522 of layer 3 along path P6.

From path P6, electrical current may be received at point S of outer-spiral track 522 within layer 3. The current flows, from point S, in a counter-clockwise direction along paths P7 and P8 back to point F of the outer-spiral track 522. Thus, the current flows approximately a full turn on the outer-spiral track 522. At point F of outer-spiral track 522, an electrical connection may couple outer-spiral track 522 of layer 3 to intermediate-spiral track 518 within layer 2 along path P9. Accordingly, as described, current flows in the outer-spiral track of each layer before propagating within the next inner track (e.g., intermediate-spiral) of each layer.

From path P9, electrical current may be received at point S of intermediate-spiral track 518 within layer 2. The current flows, from point S, in a counter-clockwise direction along paths P10 and P11 back to point F of the intermediate-spiral track 518. Thus, the current flows approximately a full turn on the intermediate-spiral track 518. At point F of intermediate-spiral track 518, a via connection may electrically couple intermediate-spiral track 518 of layer 2 to inner-spiral track 514 of layer 1 along path P12.

From path P12, electrical current may be received at point S of inner-spiral track 514 within layer 1. The current flows, from point S, in a counter-clockwise direction along paths P13 and P14 back to point F of the inner-spiral track 514. Thus, the current flows approximately a full turn on the inner-spiral track 514. At point F of inner-spiral track 514, a via connection may couple inner-spiral track 514 of layer 1 to inner-spiral track 520 of layer 2 along path P15.

From path P15, electrical current may be received at point S of inner-spiral track 520 within layer 2. The current flows, from point S, in a counter-clockwise direction along paths P16 and P17 back to point F of the inner-spiral track 520. Thus, the current flows approximately a full turn on the inner-spiral track 520. At point F of inner-spiral track 520, a via connection may electrically couple inner-spiral track 520 of layer 2 to inner-spiral track 526 of layer 6 along path P18.

From path P18, electrical current may be received at point S of inner-spiral track 526 within layer 3. The current flows, from point S, in a counter-clockwise direction along paths P19 and P20 back to point F of the inner-spiral track 526. Thus, the current flows approximately a full turn on the inner-spiral track 526. At point F of inner-spiral track 526, an electrical connection (i.e., labeled Out) may couple inner-spiral track 526 of layer 3 to other components on the chip. Accordingly, as described, current flows in the inner-spiral track of each layer before being output from the inductor structure 500.

Although each spiral track of each metal layer is about one single full turn, a spiral track with multiple turns may also be contemplated. For example, outer-spiral track 510 is about a full turn within metal layer 1. However, according to other embodiments, outer-spiral track 510 may undergo multiple turns (i.e., two or more) before electrically coupling to outer-spiral track 516 by means of path P3.

As previously indicated, the exemplary three-layer (i.e., layer 1, layer 2, and layer 3) inductor embodiments of FIGS. 2-5 described herein may also be implemented on two, four, or more metal layers. For example, FIG. 6 illustrates a two-layer version (i.e., layer 1 and layer 2) of the embodiment of FIG. 2.

Figure 6:
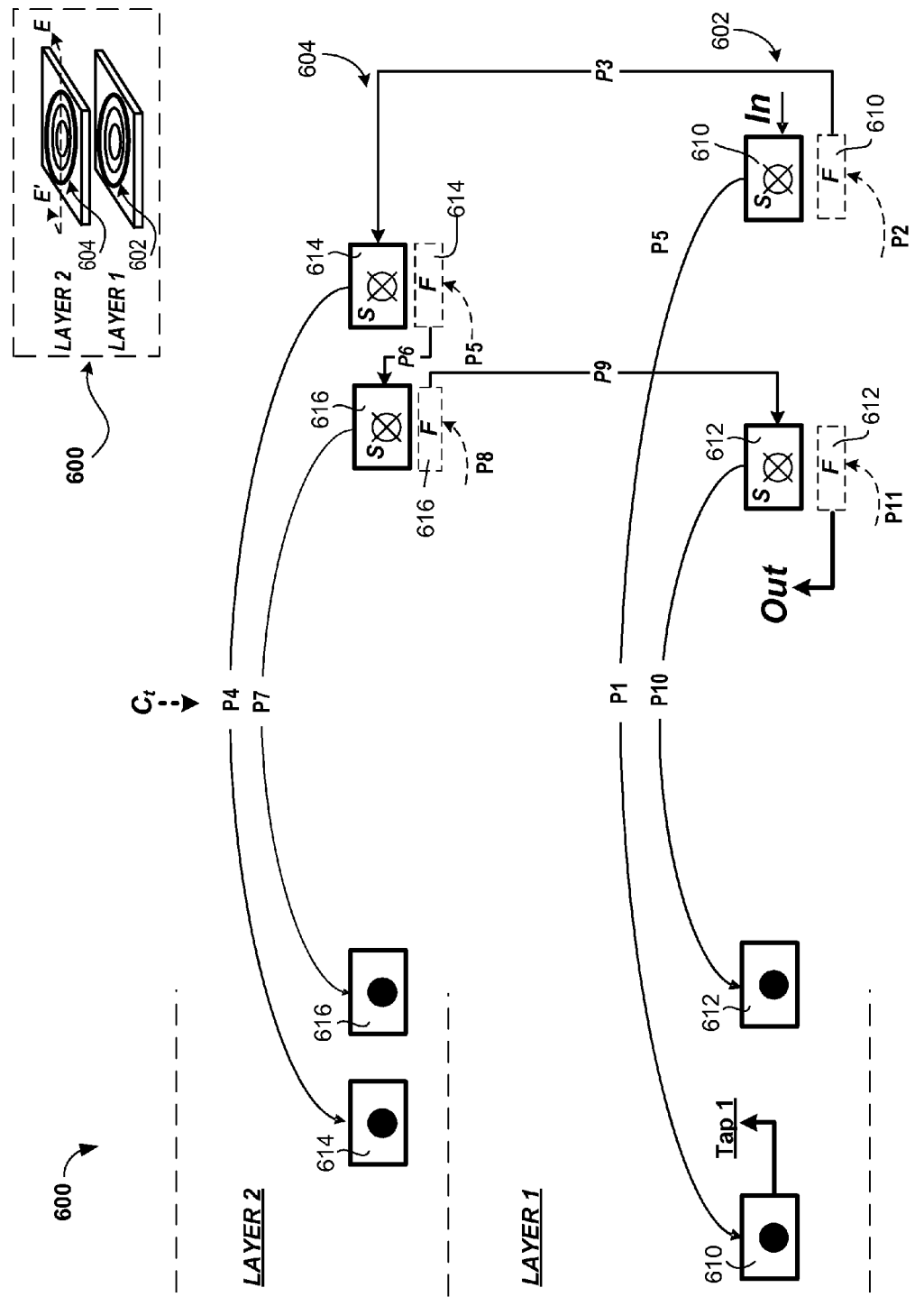
FIG. 6 is a cross-sectional view of a two-layer version of the on-chip inductor structure of FIG. 2 according to an embodiment of the invention.

FIG. 6 illustrates a cross-sectional view along axis E-E' of a semiconductor on-chip inductor structure 600 according to an exemplary embodiment. As depicted, inductor structure 600 is a two-layer version of the three-layer inductor structure 200 of FIG. 2, whereby metal layer 1 includes spiral structure 602 and metal layer 2 includes spiral structure 604. As illustrated by the cross-sectional view, spiral structure 602 within layer 1 may include outer-spiral track 610 and inner-spiral track 612, whereby each of the spiral tracks may be constructed from an electrically conductive material such as, for example, copper, tungsten, or aluminum. Also, spiral structure 604 within layer 2 may include outer-spiral track 614 and inner-spiral track 616, whereby each of these spiral tracks may be constructed from an electrically conductive material such as, for example, copper, tungsten, or aluminum.

The above-described spiral tracks may be lithographically formed (i.e., photolithography and etching) on the metal layers of a semiconductor device, whereby upon the deposition of an interlayer dielectric (ILD) material over each metal layer, both laterally and vertically adjacent spiral tracks are insulated by the ILD material. However, vertically adjacent isolated spiral tracks may be electrically coupled using one or more via connections, while laterally adjacent isolated spiral tracks may be electrically coupled using electrical conductors (e.g., copper tracks). As described in the following paragraphs, the via connections and electrical conductors may be used to electrically couple the various spiral tracks of the inductor structure 600 that exist both within and on the different metal layers. The thickness of the spiral tracks may be limited to the metal layer thicknesses while the width of the spiral tracks may be designed to range from approximately 1-50 μm, preferably between about 1-10 μm. Metal layer 1 may be about 3 μm and metal layer 2 may be about 6 μm, however, different layer thicknesses can be contemplated based on the choice of semiconductor technology utilized. However, in the above described embodiments (e.g., FIGS. 2-6), the metal layers (e.g., layers 1-3) may each have a thickness of, for example, between 1-4 μm, although other thicknesses may also be contemplated.

Also, within each metal layer, as the spiral tracks reduce in radius towards the center of spiral structure (depicted by $C_t$), their corresponding track width may be reduced (not shown). This reduction in width as the track radius approaches $C_t$ may be intended to optimally utilize the track cross-sectional area where the highest current density flows. The track current tends to flow on one side or the other of spiral tracks under the influence of high magnetic fields as seen near $C_t$ due to interaction with the magnetic fields of adjacent tracks both vertically and horizontally (commonly referred to as proximity effect). Removing track sections containing little current density reduces parasitic capacitance, increasing $f_{sr}$ and peak Q, while not increasing series resistance at high frequencies. For example, within layer 1, the track width of inner-spiral track 612 may be reduced relative to the track width of outer-spiral track 610. The reduction of track width addresses an increase in proximity effect as the spiral tracks become closer (e.g., track 612) to the center of spiral structure $C_t$. Similarly, within layer 2, the track width of inner-spiral track 616 may be reduced relative to the track width of outer-spiral track 614. The reduction of track width addresses an increase in proximity effect as the spiral tracks become closer (e.g., track 616) to the center of spiral structure $C_t$.

The following paragraphs describe the structural details and electrical connectivity between the spiral structures 602 and 604 of the inductor structure 600. Subsequently, an operational flow of current through inductor structure 600 will be described.

Within layer 1, as indicated by the numbered arrows, the outer-spiral track 610 extends one half-turn along path P1 and returns back along the remaining half-turn denoted by path P2. For illustrative clarity, return path P2 is shown by a dotted arrow denoting only the last portion of the return path of the outer-spiral track 610 back to where outer-spiral track 610 started along path P1. The start of outer-spiral track 610 along path P1 is defined by S and the return of outer-spiral track 610 after approximately a full turn is defined by F. Thus, as depicted, the start point S of the outer-spiral track 610 is electrically isolated from the end point F of the outer-spiral track 610. At point F, the end portion of the outer-spiral track 610 electrically couples to outer-spiral track 614 within layer 2 of the inductor structure 600 along path P3, whereby such inter-layer electrical coupling (i.e., between layers 1 & 2) may be provided by an electrically conductive via (not shown). Point S of the outer-spiral track 610 may be designated as the inductor structure 600 input (In).

Similarly, the inner-spiral track 612 of layer 1 extends one half-turn along path P10 and returns back along the remaining half-turn denoted by path P11. For illustrative clarity, return path P11 is shown by a dotted arrow denoting only the last portion of the return path of the inner-spiral track 612 back to where inner-spiral track 612 started along path P11. The start of inner-spiral track 612 along path P10 is defined by S and the return of inner-spiral track 612 after approximately a full turn is defined by F. Thus, as depicted, the start point S of the inner-spiral track 612 is electrically isolated from the end point F of the inner-spiral track 612. At point F, the end portion of the inner-spiral track 612 may be designated as the inductor structure 600 output (Out). At point S, the start portion of the inner-spiral track 612 may be electrically coupled to inner-spiral track 616 of layer 2 along path P9 using an electrically conductive via (not shown).

Within layer 2, as indicated by the numbered arrows, the outer-spiral track 614 extends one half-turn along path P4 and returns back along the remaining half-turn denoted by path P5. For illustrative clarity, return path P5 is shown by a dotted arrow denoting only the last portion of the return path of the outer-spiral track 614 back to where outer-spiral track 614 started along path P4. The start of outer-spiral track 614 along path P4 is defined by S and the return of outer-spiral track 614 after approximately a full turn is defined by F. Thus, as depicted, the start point S of the outer-spiral track 614 is electrically isolated from the end point F of the outer-spiral track 614. At point F, the end portion of outer-spiral track 614 electrically couples to inner-spiral track 616 within layer 2 of the inductor structure 600 along path P6, whereby such inter-spiral electrical coupling (i.e., within layer 2) may be provided by an electrically conductive connection. At point S, the start portion of outer-spiral track 614 electrically couples to outer-spiral track 610 within layer 1 of the inductor structure 600 along path P3, whereby such inter-layer electrical coupling (i.e., between layers 1 & 2) may be provided by an electrically conductive connection.

Similarly, the inner-spiral track 616 of layer 2 extends one half-turn along path P7 and returns back along the remaining half-turn denoted by path P8. For illustrative clarity, return path P8 is shown by a dotted arrow denoting only the last portion of the return path of the inner-spiral track 616 back to where inner-spiral track 616 started along path P7. The start of inner-spiral track 616 along path P7 is defined by S and the return of inner-spiral track 616 after approximately a full turn is defined by F. Thus, as depicted, the start point S of the inner-spiral track 616 is electrically isolated from the end point F of the inner-spiral track 616. At point F, the end portion of the inner-spiral track 616 electrically couples to inner-spiral track 612 of layer 1 along path P9 using an electrically conductive via (not shown). At point S, the start portion of inner-spiral track 616 is electrically coupled to outer-spiral track 614 within layer 2 of the inductor structure 600 along path P6.

As shown in FIG. 6, the turn radius of the outer-spiral 610 on layer 1 is larger than the turn radius of the outer-spiral 614 on layer 2. Thus, the turn radiuses of the outer-spiral tracks 610, 614 progressively reduce from layer 1 to layer 2. Similarly, the turn radius of the inner-spiral 616 on layer 2 is larger than the turn radius of the inner-spiral 612 on layer 1. Thus, the turn radiuses of the inner-spiral tracks 616, 612 progressively reduce from layer 2 to layer 1.

The foregoing described relationship between the radiuses of the spiral tracks enable the electrical current to follow a substantially conical path, whereby as the current is input (In) to the inductor structure 600 at spiral track 610 (i.e., point S), the current path progressively propagates along spiral tracks of reducing radius until the current reaches the output (Out) of the inductor structure 600 at spiral track 612 (i.e., point F). Further, the electrical current propagates throughout layers 1 and 2 multiple times, as does a folded inductor structure. Further, details of the electrical current flow within inductor structure 600 are provided in the following paragraphs.

Referring to FIG. 6, the electrical current flow follows the depicted sequence indicated by paths P1-P11. As illustrated, electrical current may be received by the inductor component 600 at point S (i.e., In) of outer-spiral track 610 within layer 1. The current flows, from point S, in a counter-clockwise direction along paths P1 and P2 back to point F of the outer-spiral track 610. Thus, the current flows approximately a full turn on the outer-spiral track 610. At point F of outer-spiral track 610, a via connection may electrically couple the outer-spiral track 610 of layer 1 to the outer-spiral track 614 of layer 2 along path P3.

From path P3, electrical current may be received at point S of outer-spiral track 614 within layer 2. The current flows, from point S, in a counter-clockwise direction along paths P4 and P5 back to point F of the outer-spiral track 614. Thus, the current flows approximately a full turn on the outer-spiral track 614. At point F of outer-spiral track 614, a connection may electrically couple outer-spiral track 614 of layer 2 to inner-spiral track 616 of layer 2 along path P6.

From path P6, electrical current may be received at point S of inner-spiral track 616. The current flows, from point S, in a counter-clockwise direction along paths P7 and P8 back to point F of the inner-spiral track 616. Thus, the current flows approximately a full turn on the inner-spiral track 616. At point F of inner-spiral track 616, a via connection may couple inner-spiral track 616 of layer 2 to inner-spiral track 612 of layer 1 along path P9.

From path P9, electrical current may be received at point S of inner-spiral track 612 within layer 1. The current flows, from point S, in a counter-clockwise direction along paths P10 and P11 back to point F of the inner-spiral track 612. Thus, the current flows approximately a full turn on the inner-spiral track 612. At point F of inner-spiral track 612, an electrical connection (i.e., labeled Out) may couple inner-spiral track 612 of layer 1 to other components on the chip. Accordingly, as previously described, current flows in the outer-spiral track of each layer before flowing in the inner-spiral track of each layer.

Although each spiral track of each metal layer is about one single full turn, a spiral track with multiple turns may also be contemplated. For example, outer-spiral track 610 is about a full turn within metal layer 1. However, according to other embodiments, outer-spiral track 610 may undergo multiple turns (i.e., two or more) before electrically coupling to outer-spiral track 614 by means of path P3.

The exemplary embodiments depicted in FIGS. 2-6 include spiral tracks that conduct electrical signals in a common circular direction (counter-clockwise in the exemplary embodiments) in order to maximize the positive mutual inductance between any pair of spiral tracks (e.g., adjacent lateral pair or vertically separated pair).

Figure 7A:
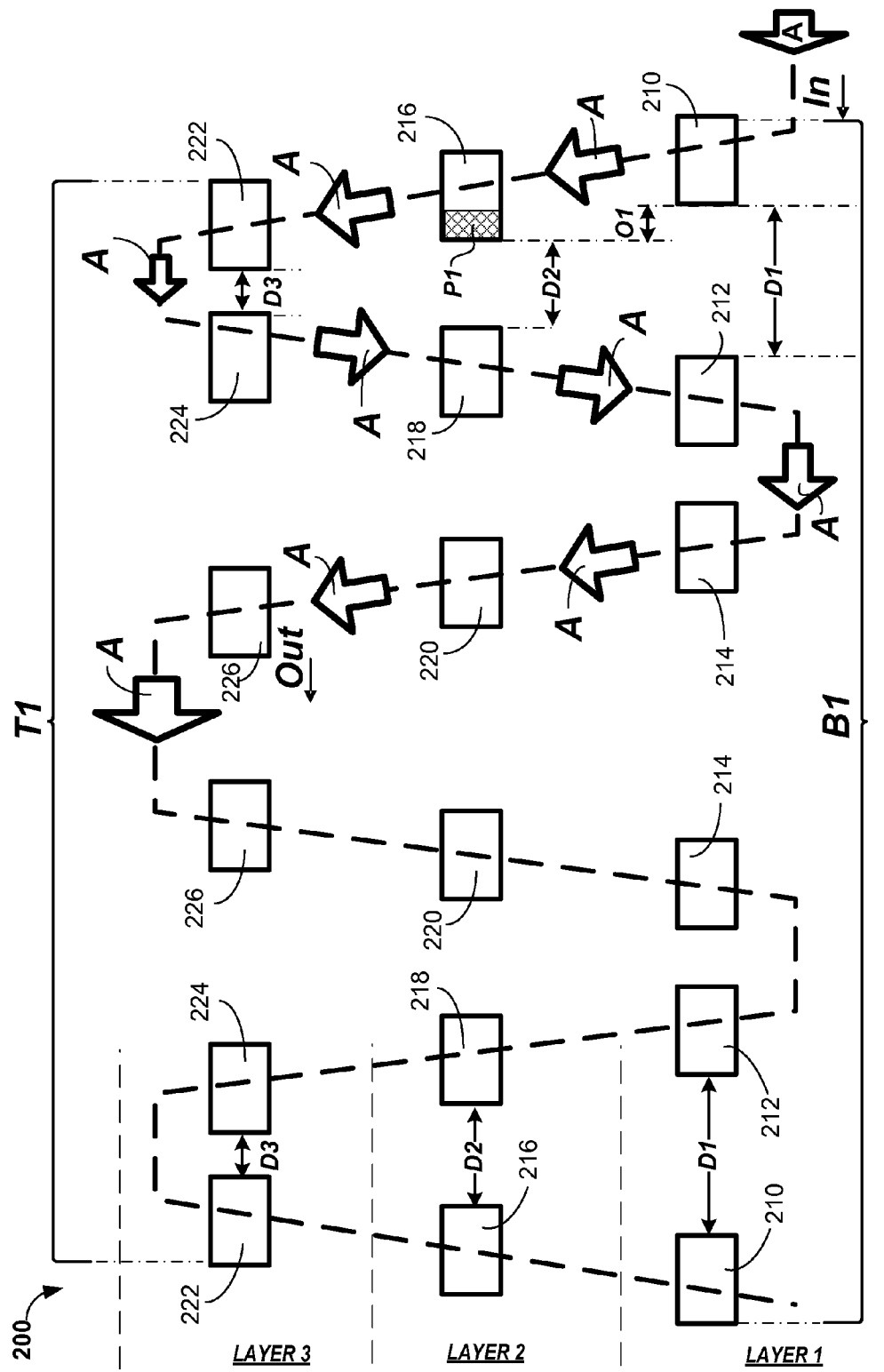
FIG. 7A is a cross-sectional view of the metallic tracks corresponding to the on-chip inductor structure of FIG. 2.

FIG. 7A is a cross-sectional view of the metallic tracks corresponding to the on-chip inductor structure 200 of FIG. 2. As illustrated, following arrows A along the cross section of the metallic tracks, the cross-sectional profile of inductor structure 200 is substantially trapezoidal (flat top) in shape.

As illustrated in FIG. 7A, the lateral distance D1 between the layer 1 outer-spiral track 210 and the layer 1 intermediate-spiral track 212 is greater than the lateral distances between both the lateral distance D2 between the layer 2 outer-spiral track 216 and the layer 2 intermediate-spiral track 218, and the lateral distance D3 between the layer 3 outer-spiral track 222 and the layer 3 intermediate-spiral track 224. By increasing lateral distance D1, the turn-to-turn capacitance between the outer-spiral track 210 and the intermediate-spiral track 212 is reduced, which in turn causes a desired increase in peak Q-factor and self resonance frequency. The lateral distance D1 between the outer-spiral track 210 and the intermediate-spiral track 212 is increased as a result of a higher expected voltage difference between the outer-spiral track 210 and the intermediate-spiral track 212 of layer 1 relative to the other laterally adjacent tracks such as, for example, outer-spiral track 216 and intermediate-spiral track 218 on layer 2, and outer-spiral track 222 and intermediate-spiral track 224 on layer 3. Since the higher expected voltage difference generates a greater Miller multiplier, the turn-to-turn capacitance is accordingly elevated by the Miller multiplier. In order to reduce this effect, the increased lateral distance D1 reduces the turn-to-turn capacitance, thereby causing a reduction in the Miller multiplied turn-to-turn capacitance. For example, if the voltage difference creates a miller multiplier of six (6) and the turn-to-turn capacitance is C, the effective turn-to-turn capacitance may become six (6) times C. If, however, by establishing lateral distance D1, C becomes C/2, the effective turn-to-turn capacitance now reduces to three (3) times C (i.e., a 50% reduction). The same rationale applies to the difference in lateral distances (i.e., D2, D3) between the spiral tracks on layers 2 and 3. Therefore, since the voltage difference between the outer-spiral track 222 and the intermediate-spiral track 224 of layer 3 is less relative to the voltage difference between the outer-spiral track 216 and the intermediate-spiral track 218 on layer 2, lateral distance D3 may be designed to be less relative to lateral distance D2.

Further referring to FIG. 7A, the spiral tracks of each layer are laterally offset with respect to the spiral tracks of other layers such that the spiral tracks on each layer are at least partially non-overlapping with respect to one another. For example, the outer-spiral track 216 of layer 2 is offset by distance O1 relative the outer-spiral track 210 of layer 1. Thus, portion P1 of outer-spiral track 216 is non-overlapping with respect to outer-spiral track 210. This has the desired effect of reducing the metal-to-metal track capacitance between the layers (e.g., layers 1 & 2), which also contributes towards desirably increasing peak Q-factor and self resonance frequency. The exemplary inductor structure 200 may, therefore, include a predetermined three-dimensional lateral displacement of the spiral tracks both within each layer and between adjacent layers of the structure. One displacement of the spiral tracks occurs within the plane of each metal layer (e.g., layer 1: displacement D1), while the other displacement occurs between the metal layers (e.g., between layers 1 & 2: offset O1).

Figure 7B:
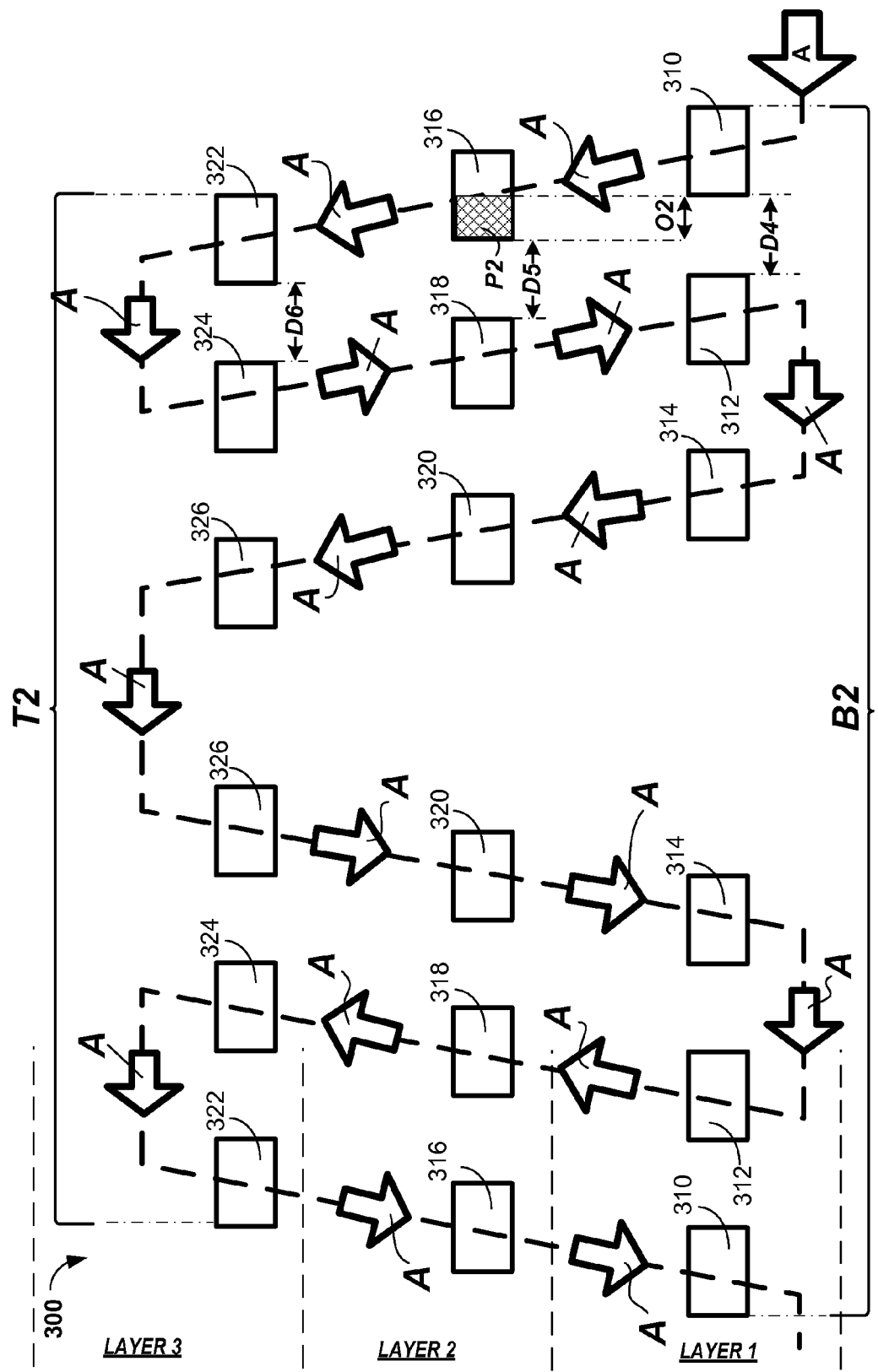
FIG. 7B is a cross-sectional view of the metallic tracks corresponding to the on-chip inductor structure of FIG. 3.

FIG. 7B is a cross-sectional view of the metallic tracks corresponding to the on-chip inductor structure 300 of FIG. 3. As illustrated, following arrows A along the cross section of the metallic tracks, the cross-sectional profile of inductor structure 200 substantially forms a parallelogram shape.

In FIG. 7B, in contrast with FIG. 7A, the lateral distance D4 between the layer 1 outer-spiral track 310 and the layer 1 intermediate-spiral track 312 is approximately the same as the lateral distances between both the lateral distance D5 between the layer 2 outer-spiral track 316 and the layer 2 intermediate-spiral track 318, and the lateral distance D6 between the layer 3 outer-spiral track 322 and the layer 3 intermediate-spiral track 324. Thus, the lateral distances between all the tracks on each of the layers are substantially the same.

Further referring to FIG. 7B, the spiral tracks of each layer are laterally offset with respect to the spiral tracks of other layers, such that the spiral tracks on each layer are at least partially non-overlapping with respect to one another. For example, outer-spiral track 316 of layer 2 is offset by distance O2 relative the outer-spiral track 310 of layer 1. Thus, portion P2 of outer-spiral track 316 is non-overlapping with respect to outer-spiral track 310. This spiral track offset pattern that exists between all the layers has the desired effect of reducing the metal-to-metal track capacitance between the layers (e.g., layers 1 & 2), which subsequently contributes towards desirably increasing peak Q-factor and self resonance frequency. Although the inductor structure 300 configuration of FIG. 3 does not benefit from the same Miller multiplier compensation that exists with the inductor structure 200 of FIG. 2, the base footprint of inductor 300, as defined by B2, may be smaller relative to the base footprint of inductor structure 200, as indicated by B1. As a result of the lateral offsetting (e.g., see FIG. 7A: D1) of the spiral tracks of inductor structure 200, the base footprint B1 of inductor structure 200 may be wider compared to the base footprint B2 of inductor structure 300. By having a smaller base footprint B2, the inductor structure 300 may benefit from a reduced capacitive coupling between the inductor structure 300 and the underlying substrate upon which the inductor structure is formed. Thus, inductor structure 300 (FIG. 3) may have less capacitive coupling relative to inductor structure 200 (FIG. 2). Additionally, the top foot print of inductor structure 300, as defined by T2, is relatively narrower compared to the top footprint of other inductor structures (i.e., inductors 200 (FIG. 7A): footprint T1; inductor 400 (FIG. 7C): footprint T3). This may provide a reduced capacitive coupling when utilizing the inductor structure 300 in a 3D stacked chip configuration, whereby the top portion of the inductor 300 is coupled to devices or components of another chip. As previously indicated, any reduction in capacitive coupling contributes towards an increased inductor performance, as measured by, for example, peak Q-factor and self resonance frequency. Also, a reduction in capacitive coupling between an inductor and a device or component of another chip (i.e., 3D stacked chips) may, for example, avoid the degradation of electrical signals that are exchanged between the stacked chips.

FIG. 7C is a cross-sectional view of the metallic tracks corresponding to the on-chip inductor structure 400 of FIG. 4. As illustrated, following arrows A along the cross section of the metallic tracks, the cross-sectional profile of inductor structure 400 also substantially forms a parallelogram shape.

In FIG. 7C, in contrast with FIG. 7A, the lateral distance D7 between the layer 1 outer-spiral track 410 and the layer 1 intermediate-spiral track 412 is approximately the same as the lateral distances between both the lateral distance D8 between the layer 2 outer-spiral track 416 and the layer 2 intermediate-spiral track 418, and the lateral distance D9 between the layer 3 outer-spiral track 422 and the layer 3 intermediate-spiral track 424. Thus, the lateral distances between all the tracks on each of the layers are substantially the same.

As illustrated in FIG. 7C, the spiral tracks of each layer are laterally offset with respect to the spiral tracks of other layers, such that the spiral tracks on each layer are at least partially non-overlapping with respect to one another. For example, outer-spiral track 416 of layer 2 is offset by distance O3 relative the outer-spiral track 410 of layer 1. Thus, portion P3 of outer-spiral track 416 is non-overlapping with respect to outer-spiral track 410. This spiral track offset pattern that exists between all the layers has the desired effect of reducing the metal-to-metal track capacitance between the layers (e.g., layers 1 & 2), which subsequently contributes towards desirably increasing peak Q-factor and self resonance frequency. Although the inductor structure 400 configuration of FIG. 4 does not benefit from the same Miller multiplier compensation that exists with the inductor structure 200 of FIG. 2, the base footprint of inductor 400, as defined by B3, may be smaller relative to the base footprint of both inductor structures 200 and 300, as indicated by B1 and B2, respectively. As previously described, based on the lateral offsetting (e.g., see FIG. 7A: D1) of the spiral tracks of inductor structure 200 (FIG. 7A), the base footprint B1 of inductor structure 200 may be wider compared to the base footprint B3 of inductor structure 400. Further, the radiuses of the spiral tracks of inductor structure 300 (FIG. 7B) decrease in radius from layer 1 to layer 3. Therefore, the base footprint B2 of this structure is relatively wide compared to the top footprint T2. In contrast, the radiuses of the spiral tracks of inductor structure 400 increase in radius from layer 1 to layer 3. Therefore, the base footprint B3 of this structure is relatively narrow compared to the top footprint T3. By having a smaller base footprint B3, the inductor structure 400 may benefit from a reduced capacitive coupling between the inductor structure 400 and the underlying substrate upon which the inductor structure is formed. Thus, inductor structure 400 (FIG. 4) may have less capacitive coupling relative to both inductor structure 200 (FIG. 2) and inductor structure 300 (FIG. 3). However, the top foot print of inductor structure 400, as defined by T3, is relatively wider compared to the top footprint of other inductor structures (e.g., inductors 200 (FIG. 7A): footprint T1; inductor 300 (FIG. 7B): footprint T2). This may provide an increased capacitive coupling when utilizing the inductor structure 400 in a 3D stacked chip configuration.

Figure 7D:
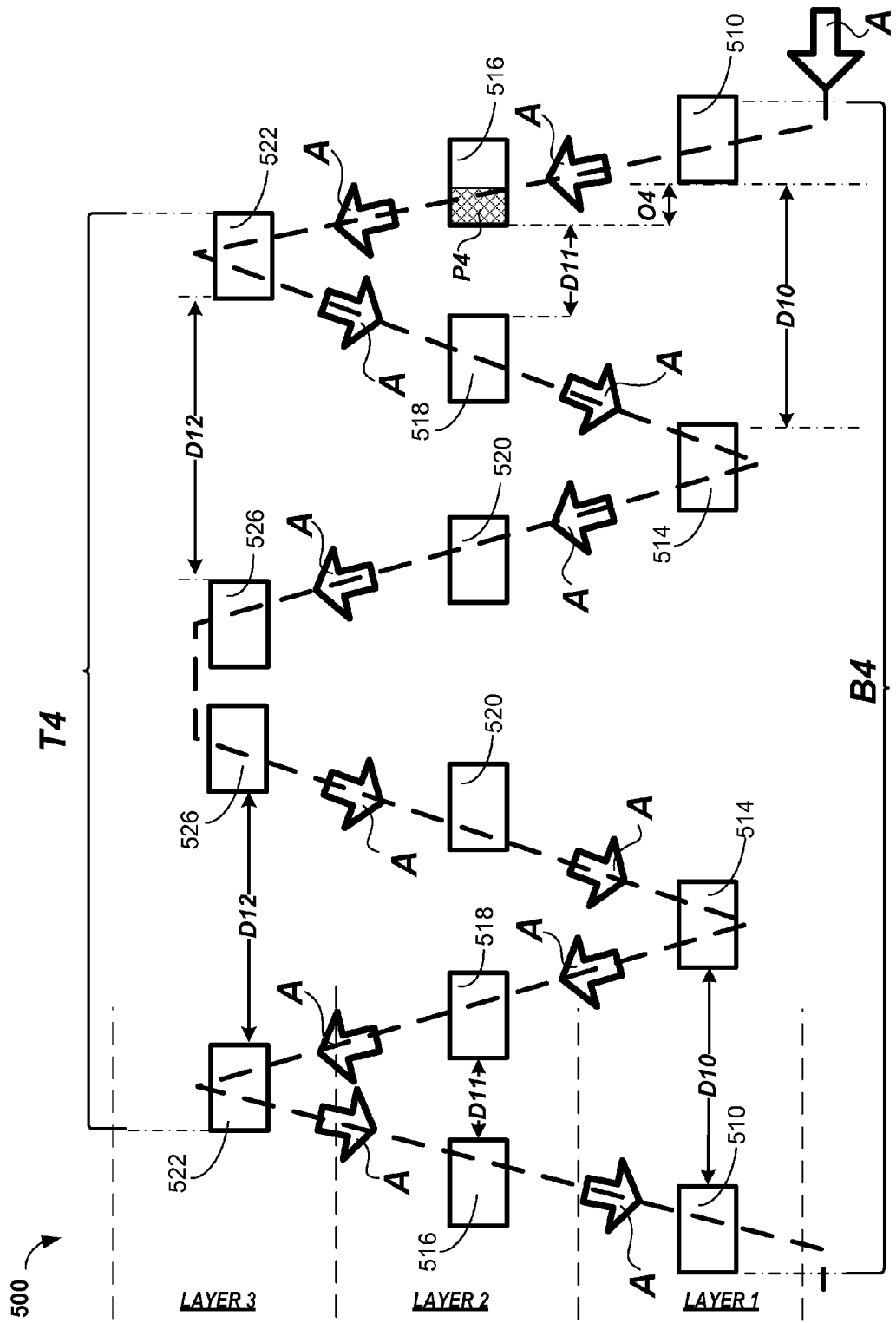
FIG. 7D is a cross-sectional view of the metallic tracks corresponding to the on-chip inductor structure of FIG. 5.

FIG. 7D is a cross-sectional view of the metallic tracks corresponding to the on-chip inductor structure 500 of FIG. 5. As illustrated, following arrows A along the cross section of the metallic tracks, the cross-sectional profile of inductor structure 500 is substantially triangular (pointed top) in shape.

As illustrated in FIG. 7D, the lateral distance D10 between the layer 1 outer-spiral track 510 and the layer 1 inner-spiral track 514 is greater than the lateral distance between the lateral distance D11 between the layer 2 outer-spiral track 516 and the layer 2 intermediate-spiral track 518. By increasing lateral distance D10, the turn-to-turn capacitance between the outer-spiral track 510 and the inner-spiral track 514 is reduced, which in turn causes a desired increase in Q-factor and self resonance frequency. The lateral distance D10 between the outer-spiral track 510 and the inner-spiral track 514 is increased as a result of a higher expected voltage difference between the outer-spiral track 510 and the inner-spiral track 514 of layer 1 relative to the other laterally adjacent tracks such as, for example, outer-spiral track 516 and intermediate-spiral track 518 on layer 2. Since the higher expected voltage difference generates a greater Miller multiplier, the turn-to-turn capacitance is accordingly elevated by the Miller multiplier. In order to reduce this effect, the increased lateral distance D10 reduces the turn-to-turn capacitance, thereby causing a reduction in the Miller multiplied turn-to-turn capacitance. As with the structure of FIG. 7A, for example, if the voltage difference creates a miller multiplier of six (6) and the turn-to-turn capacitance is C, the effective turn-to-turn capacitance may become six (6) times C. If, however, by establishing lateral distance D10, C becomes C/2, the effective turn-to-turn capacitance now reduces to three (3) times C (i.e., a 50% reduction). The same rationale applies to the difference in lateral distance (i.e., D11) between the spiral tracks on layer 2, which is less than D10 based on a smaller existing voltage difference between the layer 2 outer-spiral track 516 and the layer 2 intermediate-spiral track 518 compared the layer 1 spiral tracks. Further, as depicted, the lateral distance D12 between the outer-spiral track 522 and the inner-spiral track 526 of layer 3 is greater than both D11 on layer 2 and D10 on layer 1. Therefore, the turn-to-turn capacitance on layer 3 is relative small compared to the turn-to-turn capacitance on layers 2 and 3.

Further referring to FIG. 7D, the spiral tracks of each layer are laterally offset with respect to the spiral tracks of other layers such that the spiral tracks on each layer are at least partially non-overlapping with respect to one another. For example, the outer-spiral track 516 of layer 2 is offset by distance O4 relative the outer-spiral track 510 of layer 1. Thus, portion P4 of outer-spiral track 516 is non-overlapping with respect to outer-spiral track 510. This has the desired effect of reducing the metal-to-metal track capacitance between the layers (e.g., layers 1 & 2), which also contributes towards desirably increasing Q-factor and self resonance frequency. The exemplary inductor structure 500 may, therefore, include a predetermined three-dimensional lateral displacement of the spiral tracks both within each layer and between adjacent layers of the structure. One displacement of the spiral tracks occurs within the plane of each metal layer (e.g., layer 1: displacement D10), while the other displacement occurs between the metal layers (e.g., between layers 1 & 2: offset O4).

As shown in FIG. 7D, the outer-spiral track 522 within layer 3 includes little to no overlap with both the outer-spiral track 516 within layer 2 and the intermediate-spiral track 518 within layer 2. Thus, in comparison with inductor structures 200, 300, and 400, inductor structure 500 includes the least metal-to-metal capacitance caused by the overlap of spiral tracks on the different layers. Therefore, inductor structure 500 may exhibit an increased peak Q-factor and self resonance frequency performance compared to the other exemplary embodiments. Although the example non-overlapping region defined by P4 is such that some portion of the outer-spiral track 516 on layer 2 overlaps with some portion of the outer-spiral track 510 on layer 1, the non-overlapping region may also include a total non-overlap between outer-spiral track 516 (layer 2) and outer-spiral track 510 (layer 1). For example, outer-spiral track 522 on layer 3 may include a non-overlapping region having a total non-overlap with both or either outer-spiral track 516 (layer 2) and intermediate-spiral track 518 (layer 2).

The cross sectional track profiles for the described embodiments may vary according to the number of metal layers these embodiments are implemented on. For example, in some implementations, the cross sectional track profiles may approximate a sinusoidal shape. For example, in other implementations, the cross sectional track profiles may approximate a square wave having rounded edges (i.e., beveled solenoid), whereby the rounded edges may occur as a result of the different turn radiuses of the spiral tracks on each layer at the outer layer regions, while maintaining substantially the same turn radiuses of the spiral tracks at the intermediate layer regions. According to yet other implementations, the cross sectional track profiles may include a combination of both triangular and trapezoidal shapes.

Figure 8A:
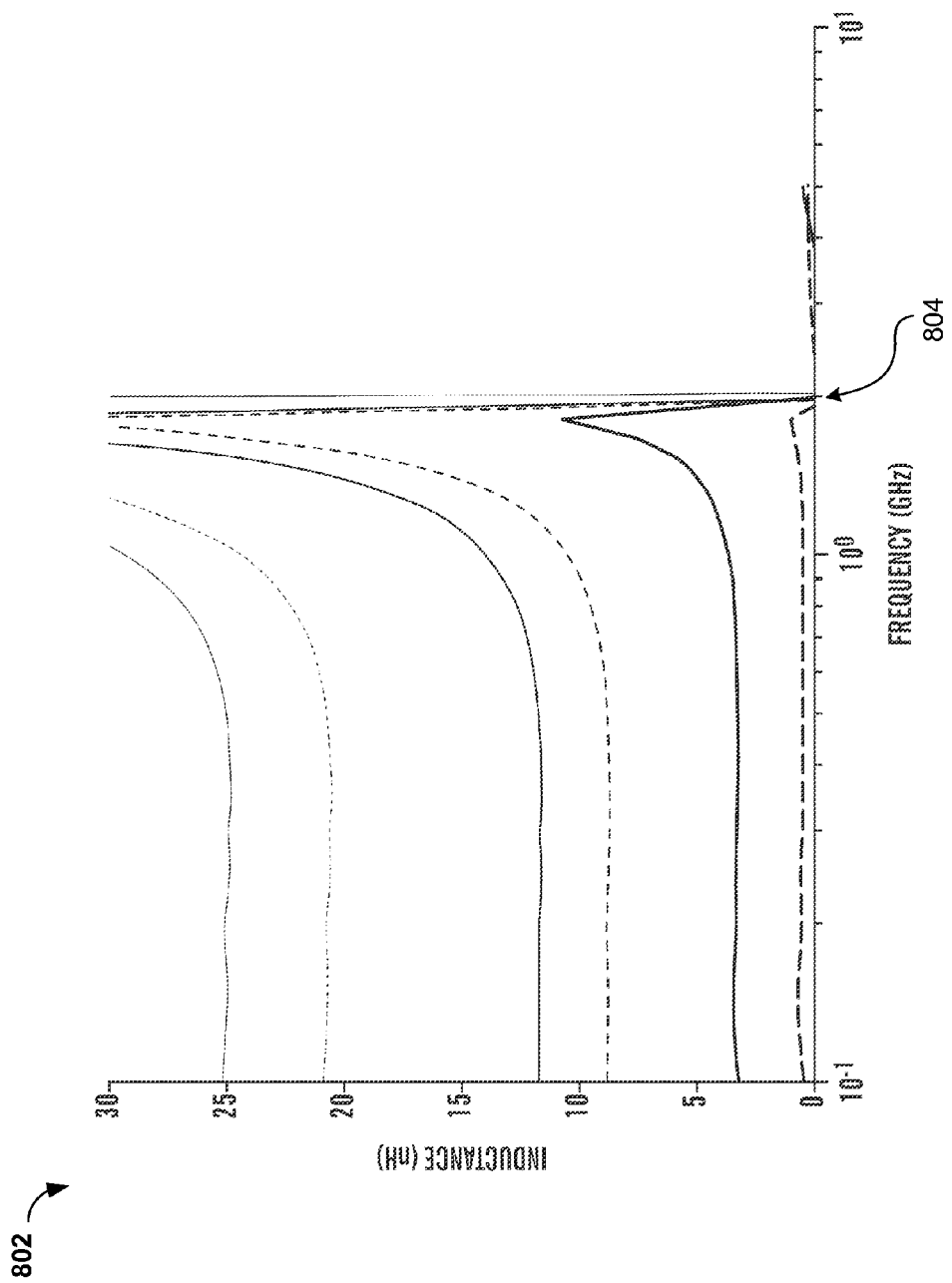
FIGS. 8A and 8B are graphs depicting the relationship between inductance, Q-factor, and self resonance frequency for known series stacked inductors.
Figure 8B:
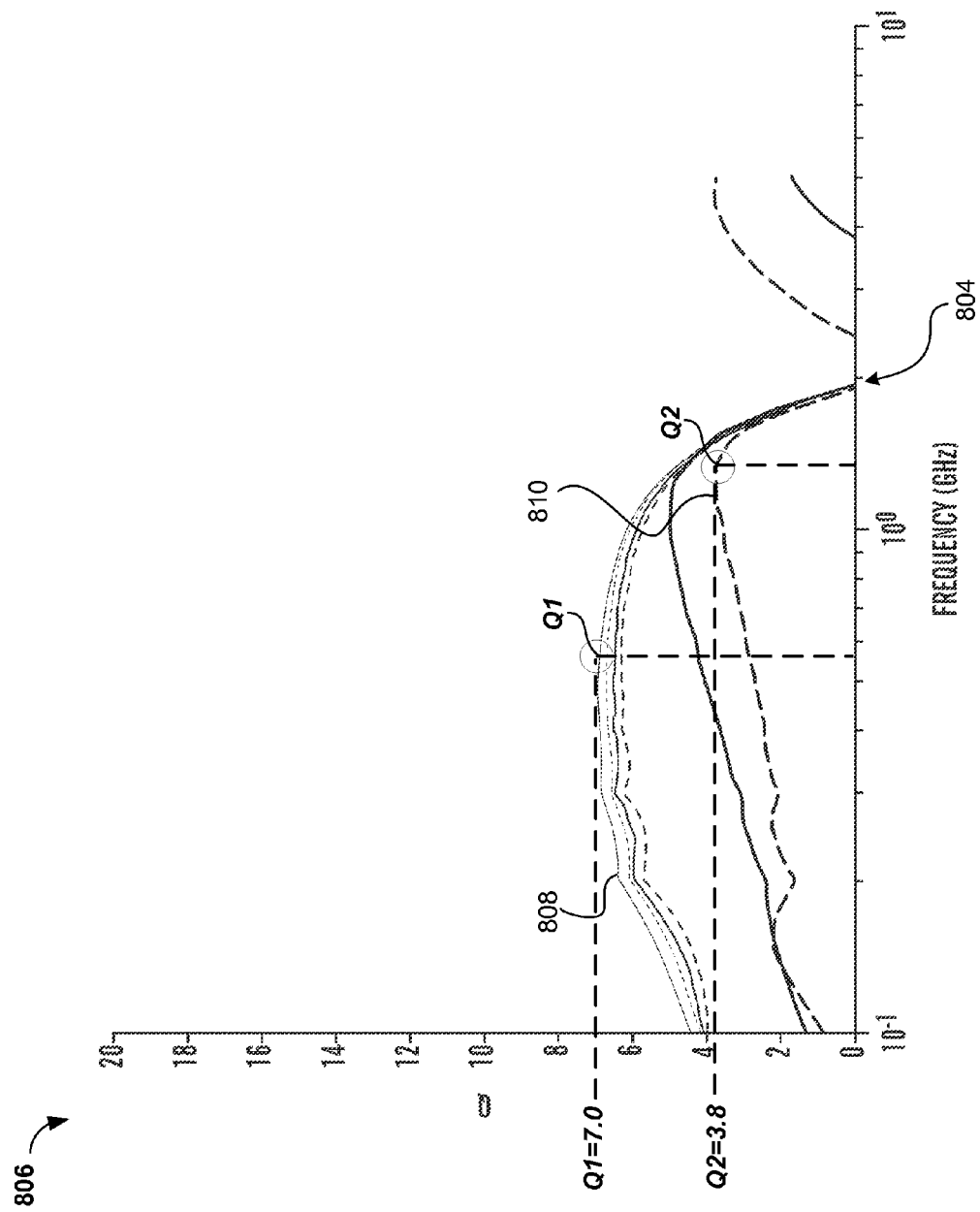

FIGS. 8A and 8B are graphs depicting the relationship between inductance values, Q-factor, and self resonance frequency for a known multi-port, series stacked inductor. Referring to FIG. 8A, graph 802 illustrates different inductance values and their corresponding self resonance frequency values. The different inductance values may apply to measuring the inductance across different ports or taps of a series stacked inductor. The self-resonance frequency is defined as the frequency at which the inductance curve goes to zero. As shown, multiple different inductance values can be achieved between the various taps on a known multi-port, series stacked inductor. Also as shown, a self resonance frequency 804 of approximately 2 GHz is achieved for the known multi-port, series stacked inductor structure (e.g., see FIG. 1).

Referring now to FIG. 8B, graph 806 illustrates different inductance values and their corresponding Q-factor values for a known multi-port, series stacked inductor. The different curves on the graph may apply to different inductance values across different ports or taps of the series stacked inductor. As previously described, the self resonance frequency 804 is approximately 2 GHz for the series stacked inductor structure. For example, curve 808 is the Q factor of the lowest inductance value measured between the input and one of the ports or taps of the series stacked inductor structure, and has a peak Q factor value, as defined by Q1, of about 7.0. Also, curve 810 is the Q factor of the highest inductance value that may be measured between the input and output of the series stacked inductor structure, and has a Peak Q factor, as defined by Q2, of about 3.8. Thus, for the series stacked inductor structure, the Q-factor may range between about 3.8-7.0.

Figure 9A:
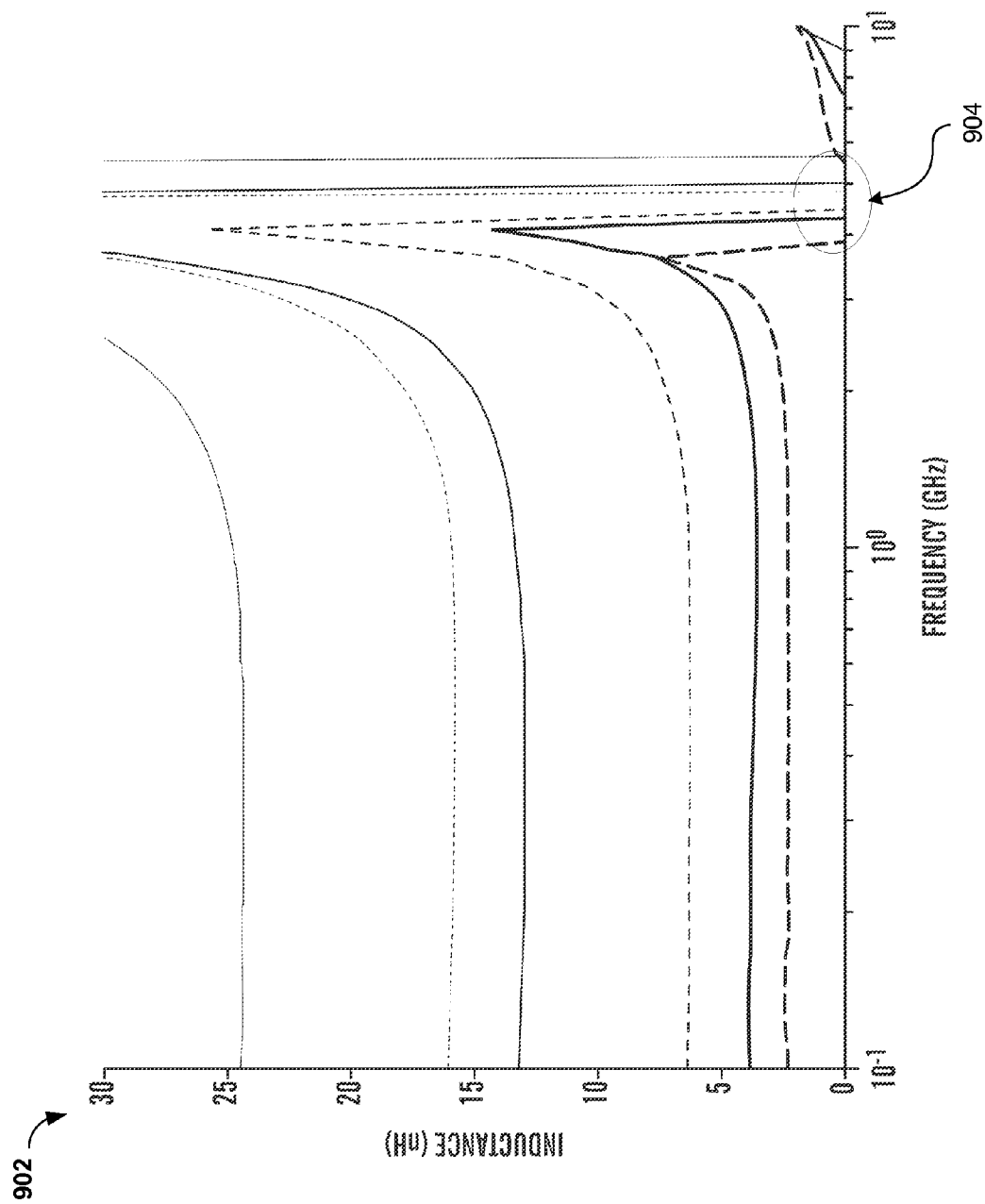
FIGS. 9A and 9B are graphs depicting the relationship between inductance, Q-factor, and self resonance frequency for a folded conical inductor structure such as the exemplary embodiment illustrated in FIG. 2.
Figure 9B:
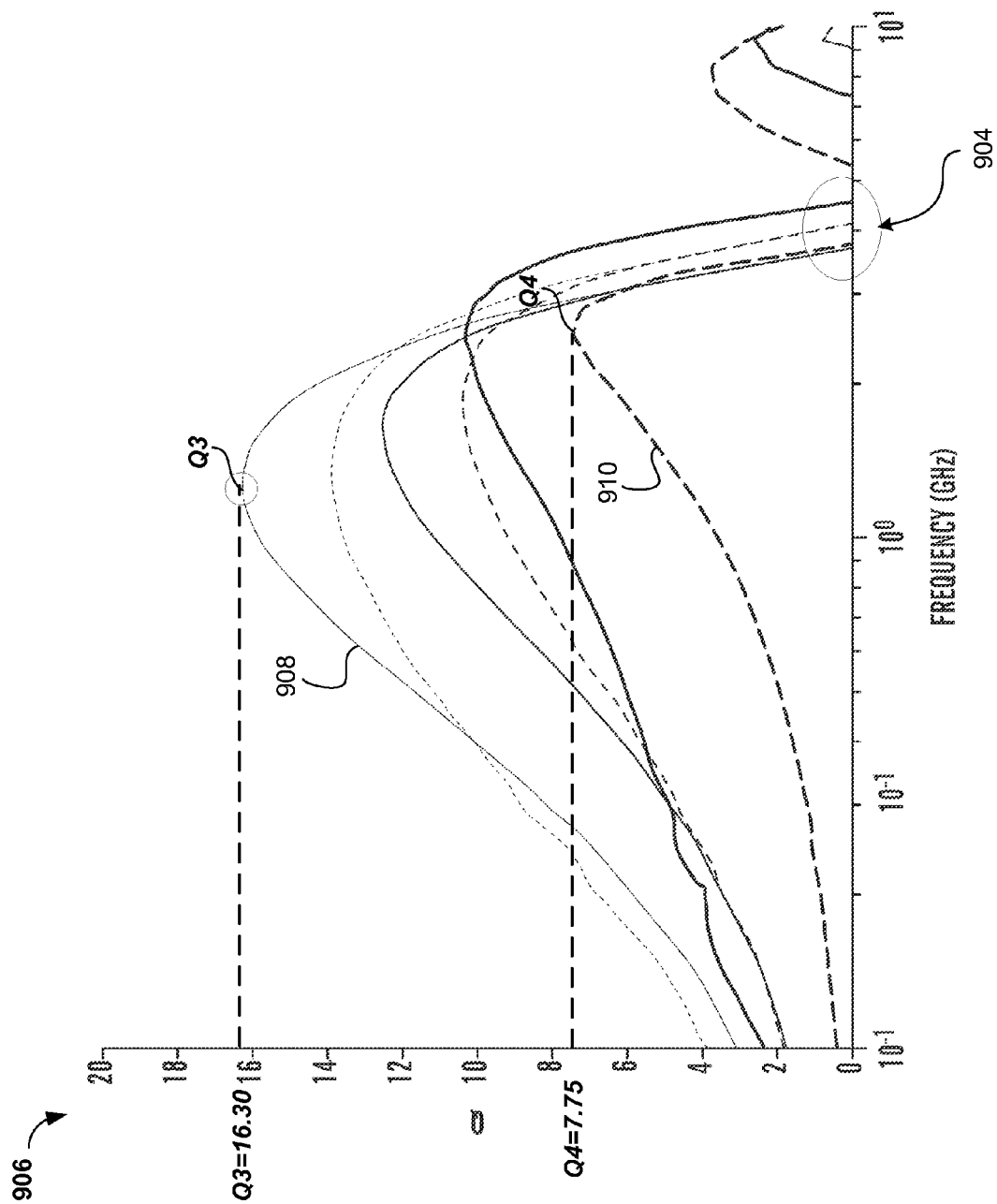

FIGS. 9A and 9B are graphs depicting the relationship between inductance, Q-factor, and self resonance frequency for a folded conical inductor structure such as the exemplary embodiment illustrated in FIG. 2. Referring to FIG. 9A, graph 902 illustrates different inductance values and their corresponding self resonance frequency values. The self-resonance frequency may be defined as the frequency at which the inductance curve goes to zero. The different inductance values may apply to measuring the inductance across different ports or taps of a folded conical inductor structure. As shown, multiple different inductance values can be achieved between the various taps on a folded conical inductor structure. Also as shown, a self resonance frequency 904 of approximately 4-6 GHz is achieved for the folded conical inductor structure (e.g., see FIG. 2).

Referring now to FIG. 9B, graph 906 illustrates different inductance values and their corresponding Q-factor values for a folded conical inductor structure. The different curves on the graph may apply to different inductance values across different ports or taps of the folded conical inductor structure. As previously described, the self resonance frequency 904 is approximately 4-6 GHz for the folded conical inductor structure. For example, curve 908 is the Q-factor of the lowest inductance value measure between the input and one of the ports or taps of the folded conical inductor structure, and has a Q factor value, as defined by Q3, of about 16.3. Also, curve 910 is the Q-factor of the highest inductance value that may be measured between the input and output of the folded conical inductor structure. The highest inductance value curve may have a Q-factor value, as defined by Q4, of approximately 7.75. Thus, for the folded conical inductor structure, the Q-factor may range between about 7.75-16.3. Accordingly, the folded conical inductor structure desirably exhibits both an increased Q-factor and self resonance frequency compared to a known series stacked inductor, as well as exhibiting similar variability in inductance values across the multiple taps.

It may be appreciated that the above described exemplary on-chip inductor structures may also be implemented as discrete inductor components without necessarily being formed on a semiconductor or other substrate type used to manufacture an integrated circuit.

Figure 10:
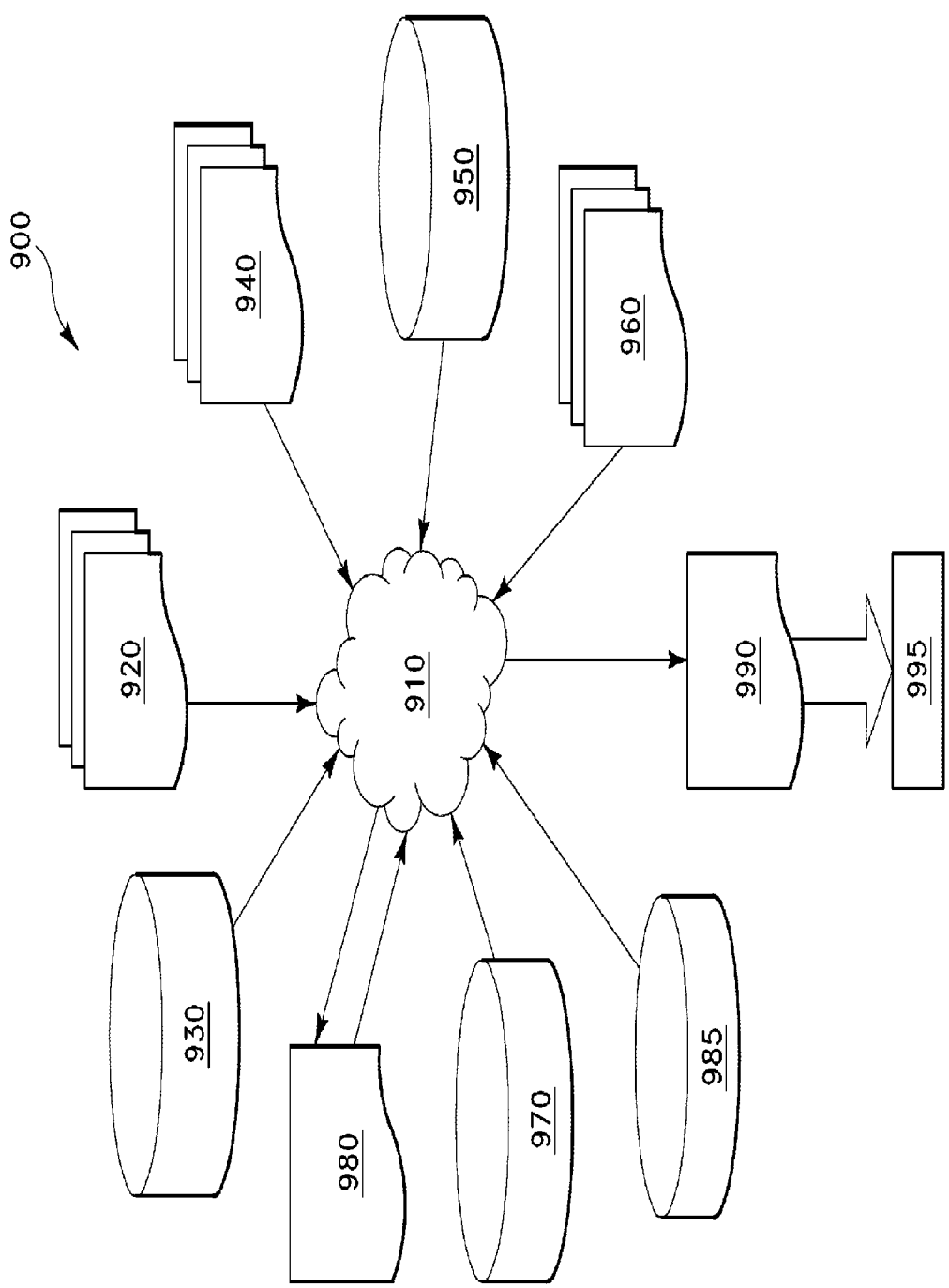
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structure and/or device described above and shown in FIGS. 2-6. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. In one embodiment, the design structure 920 comprises design data used in a design process and comprising information describing the embodiments of the invention with respect to the structures as shown in FIGS. 2-6. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention, as shown in FIGS. 2-6. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-6 to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIGS. 2-6. In one embodiment, design structure 990 may comprise a compiled, executable HDL simulation model that functionally simulates the device structures shown in FIGS. 2-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 2-6. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor inductor structure comprising:
   a first spiral structure, located on a first metal layer, having a first outer-spiral electrically conductive track and a first inner-spiral electrically conductive track separated from the first outer-spiral electrically conductive track by a first dielectric material; and
   a second spiral structure, located on a second metal layer, having a second outer-spiral electrically conductive track and a second inner-spiral electrically conductive track, the first outer-spiral electrically conductive track electrically coupled to an input of the second outer-spiral electrically conductive track and the first inner-spiral electrically conductive track electrically coupled to an output of the second inner-spiral spiral electrically conductive track, wherein the second outer-spiral electrically conductive track comprises non-overlapping conductive regions and overlapping conductive regions with the first outer-spiral electrically conductive track and wherein the second inner-spiral has conductive regions that are entirely non-overlapping with the first inner-spiral electrically conductive track.

2. The structure of claim 1, wherein the first outer-spiral electrically conductive track, the first inner-spiral electrically conductive track, and the second outer-spiral electrically conductive track, and the second inner-spiral electrically conductive track each comprise a track width of about 2-50 µm.

3. The structure of claim 1, wherein the first metal layer comprises a thickness of about 1-4 µm and the second metal layer comprises a thickness of about 1-4 µm.

4. A design structure tangibly embodied in a machine readable medium for designing, manufacturing, or testing an integrated circuit, the design structure comprising:
   a first spiral structure, located on a first metal layer, having a first outer-spiral electrically conductive track and a first inner-spiral electrically conductive track separated from the first outer-spiral electrically conductive track by a first dielectric material; and
   a second spiral structure, located on a second metal layer, having a second outer-spiral electrically conductive track and a second inner-spiral electrically conductive track, the first outer-spiral electrically conductive track electrically coupled to an input of the second outer-spiral electrically conductive track and the first inner-spiral electrically conductive track electrically coupled to an output of the second inner-spiral spiral electrically conductive track, wherein the second outer-spiral electrically conductive track comprises non-overlapping conductive regions and overlapping conductive regions with the first outer-spiral electrically conductive track and wherein the second inner-spiral has conductive regions that are entirely non-overlapping with the first inner-spiral electrically conductive track.

* * * * *